United States Patent [19]
Tsuda et al.

[11] Patent Number: 5,451,798
[45] Date of Patent: Sep. 19, 1995

[54] SEMICONDUCTOR DEVICE AND ITS FABRICATION METHOD

[75] Inventors: Hisanori Tsuda, Atsugi; Toru Koizumi, Yokohama; Hidenori Watanabe, Hiratsuka, all of Japan

[73] Assignee: Canon Kabushiki Kaisha, Tokyo, Japan

[21] Appl. No.: 206,729

[22] Filed: Mar. 7, 1994

[30] Foreign Application Priority Data

Mar. 18, 1993 [JP] Japan .................................. 5-058912
Nov. 29, 1993 [JP] Japan .................................. 5-297672
Dec. 8, 1993 [JP] Japan .................................. 5-307807

[51] Int. Cl.$^6$ .......................................... H01L 29/68
[52] U.S. Cl. .............................. 257/139; 257/77; 257/133; 257/138; 257/212; 257/347; 257/378; 257/341
[58] Field of Search ............... 257/133, 138, 139, 77, 257/212, 347, 378, 341

[56] References Cited

U.S. PATENT DOCUMENTS

5,126,169  6/1992  Ishihara et al. .................. 427/255.1
5,126,806  6/1992  Sakurai et al. ..................... 257/139

OTHER PUBLICATIONS

"High–Gain Lateral Bipolar Action in a MOSFET Structure", Sophie Verdonct–Vandebroek et al., IEEE Trans. on Electron Devices, vol. 38, No. 11, Nov. 1991, pp. 2487–2496.

"High–Gain Lateral P–N–P Bipolar Action in a P–MOSFET Structure", Sophie Verdonckt–Vanderbroek, et al., IEEE Trans. on Electron Devices, vol. 13, No. 6, Jun. 1992, pp. 312–313.

"An SOI Voltage-Controlled Bipolar-MOS Device", Jean-Pierre Colinge, IEEE Trans. on Electron Devices, vol. ED-34, No. 4, Apr. 1987, pp. 845–849.

"A Versatile, SOI BiCMOS Technology With Complementary Lateral BJI's", Stephen Parke et al., IEDM, 1992, pp. 33–35.

"A High-Performance Lateral Bipolar Transistor Fabricated on SIMOX", Stephen Parke et al., IEEE Trans. Electron Device Letters, vol. EDL-14, No. 1, Jan. 1993, pp. 33–35.

*Primary Examiner*—Edward Wojciechowicz
*Attorney, Agent, or Firm*—Fitzpatrick, Cella, Harper & Scinto

[57] ABSTRACT

A semiconductor device comprises an insulating region residing adjacent to a first semiconductor region, a control electrode residing via the insulating region, a second semiconductor region and a third semiconductor region, which have an opposite conduction type to that of the first semiconductor region, residing adjacent to and carrying therebetween the first semiconductor region. When the first, second and third semiconductor regions and the control electrode are grounded, the first semiconductor region in contact with the insulating layer is adjusted to be in weak inversion state, and the potential of the control electrode and that of the first semiconductor region are electrically coupled to be operable.

12 Claims, 37 Drawing Sheets

GATE VOLTAGE (volt)

$V_G$

SEMICONDUCTOR DEVICE AND ITS FABRICATION METHOD

BACKGROUND OF THE INVENTION

1. Field of the Invention

The present invention relates to semiconductor devices and fabrication methods thereof. In particular, the invention relates to semiconductor devices formed on an SOI (Silicon on Insulator) substrate and fabrication methods thereof. Also, the invention relates to bipolar transistors having a control electrode formed via an insulating film on a base region.

2. Related Background Art

In the development of an advanced information society, there has been a great contribution of improved technology for semiconductor devices such as transistors. Among such devices is included a vertical bipolar transistor such as a planar bipolar transistor. The vertical bipolar transistor operates at high speed as a single element, and can act effectively for current amplification and switching. However, when incorporated as an element to an integrated circuit, the vertical bipolar transistor is difficult to combine with a condenser (capacitor) or other transistor resulting from the problem of the process times. One method of constituting an integrated circuit by the combination of a bipolar transistor with other elements is to laterally arrange the bipolar transistor to enhance coordination with the process times. There is a Bi-CMOS structure in which a MOS transistor is chose as another element to combine with the bipolar transistor. Bi-CMOS allows for the design of logic with high speed and low consumption power, because the bipolar transistor operating at high speed and the MOS transistor operating at high speed and the MOS transistor operating at low consumption power can be incorporated into one IC.

The process of incorporating the bipolar transistor as one element in an IC of a Bi-CMOS fabricated on a silicon wafer is referred to as a silicon wafer bulk process. Conventionally, the vertical bipolar transistor and the lateral bipolar transistor has been formed through the silicon wafer bulk process, as shown in FIGS. 67 and 68.

In FIG. 67, and NPN-type vertical bipolar transistor 301 is electrically separated from other elements by an element separation region 302. Herein, 303 is a P-type silicon substrate, 304 is an N+-type region which is a collector region for the vertical bipolar transistor 301, 305 is an N−-type epitaxial region, 306 is a collector lead-out layer, 307 is a P-type region for element separation, 308 is a selective oxidation region, 309 is a P-type base region, 310 is an N+-type emitter region, 311 is an interlayer insulating layer, 312, 313, and 314 are Al electrodes, and 315 is a passivation insulating layer.

In FIG. 68, a PNP-type lateral bipolar transistor is shown. The PNP-type lateral bipolar transistor 321 is electrically separated from other elements by an element separation region 322. Herein, 323 is a P-type silicon substrate, 324 is an N+-type region which is a base region for the lateral bipolar transistor 321, 325 is an N−-type epitaxial region, 326 is a base lead-out layer, 327 is a P-type region for element separation, 328 is a selective oxidation region, 329 is a P+-type emitter region, 330 is an P+-type collector region, 331 is an interlayer insulating layer, 332, 333, and 334 and Al electrodes, and 335 is a passivation insulating layer.

In the silicon waver bulk process, if the element separation region for separation the transistor from other elements is not provided as above described, some elements bring about latch-up or a parasitic transistor is produced. Or even if the element separation region is provided, the element separation may not be successful. For these reasons, ICs sometimes malfunction and become inoperable due to the design.

In practice, a Bi-CMOS is used for a decoder unit such as a DRAM, and has a structure as illustrated in FIGS. 69A and 69B. However, when this Bi-CMOS is formed of bulk silicon, the process becomes extremely complex because when fabricating a CMOS and a vertical bipolar transistor, element separation must be performed. Therefore, the yield is reduced and the cost is increased. If the lateral bipolar transistor is fabricated in bulk, the process times may be decreased, but the element separation region must be made. To resolve this problem, numerous research has been performed for forming Bi-CMOS on the SOI substrate. The fabrication of Bi-CMOS using the SOI substrate. The fabrication of Bi-CMOS using the SOI substrate allows the dielectric separation between elements to be made simpler. When fabricating a bipolar transistor using the SOI substrate, the lateral bipolar transistor may be fabricated in a smaller number of process times. The lateral bipolar transistor may be inferior in performance to the vertical bipolar transistor, but can be fabricated through a fabricating process which is also used for the CMOS fabrication. Further, since the lateral bipolar transistor is fabricated on the SOI structure, it can eliminate any external base between emitter and base which will cause a degradation of current amplification gain ($h_{FE}$) SO that its characteristics can be improved.

The method of forming a MOS transistor on the SOI substrate is suitable from the respects of suppressing the short channel effect and making the microstructure of an element. For the above reasons, the method of forming Bi-CMOS having lateral bipolar transistor on the SOI substrate is expected to be promising.

In fabricating Bi-CMOS on the SOI substrate, the lower voltage is required from a point of withstanding voltage and consumption of power of an element for the microstructure of necessary elements. However, in the bipolar transistor, the potential $V_{BE}$ between emitter and base is not zero volts, and may be about 0.6 to 0.7 volts at minimum. Consequently in a circuit producing waveforms as shown in FIG. 70, the amplitude of a signal transferred is reduced 1.2 to 1.4 volts from the power source voltage of 3.3 volts, and it is necessary that the effective voltage for driving is 1.9 to 2.1 volts. That it, the on-state voltage of a bipolar transistor is about 0.7V while the on-state voltage of a MOS transistor is about 0.3 to 0.4V.

For such reasons, there is a problem that the driving power for a Bi-CMOS is extremely degraded at low voltages, for which it is the only way in the state of the art to construct a Bi-CMOS with the MOS circuit when the lower voltage ICs for use with portable commodities are made or the reduction of power voltage due to a microstructure is obliged. The construction only with the MOS circuit may not allow the high speed IC to be fabricated.

According to the present invention one method proposed for resolving this problem is one in which a bipolar transistor provided with a control electrode on the base region (hereinafter referred to as a bipolar transistor with control electrode) is used to reduce the on-state voltage equivalent to that of the MOS transistor. This transistor can provide an on-state current with a large threshold for the on-state voltage by applying a voltage to the control electrode to adjust the base region to be in a weak inversion state (the p-type base region becomes i-type for the NPN transistor).

FIG. 71 shows a structure of the bipolar transistor with control electrode. In FIG. 71, 501 is an oxide film, 502 is a collector, 503 is a base, 504 is an emitter, 505 is a collector, 503 is a base, 504 is an emitter, 505 is an oxide film (insulating film), 506 is a control electrode, 507 is in interlayer insulating film, and 508 is a metal electrode.

FIG. 72 shows a gammel plot diagram of the bipolar transistor with control electrode. In FIG. 72, the solid line indicates the characteristic of the bipolar transistor with control electrode, and the dashed line indicates the characteristic of a conventional bipolar transistor. The axis of ordinates indicates the base current ($I_B$) and the collector current ($I_0$), and the axis of abscissas indicates the base voltage. Supposing that the on-state current occurs when the collector current ($I_0$) flows at 1 $\mu$A, it will be found that the on-state voltage of a conventional bipolar transistor not having control electrode is about 0.7V while that of the bipolar transistor with control electrode is smaller, such as about 0.4V. That is, the lateral bipolar transistor with control electrode can generate a equal on-state current with smaller on-state voltage than the bipolar transistor having no control electrode.

On the other hand, it is desired that the bipolar transistor with control electrode may be operated at a higher speed. However, since the transistor of FIG. 71 is of the lateral type, the base width ($t_m$ in FIG. 71) is of the lateral type, the base width ($t_m$ in FIG. 71) significantly affecting the high speed characteristic may be determined by a photolithography technique. In the state of the art, the base width becomes about 0.5 $\mu$m at a minimum, making it difficult to fabricate the high speed transistor. Hence, according to the present invention a fabrication method is devised for reducing the base width of the bipolar transistor with control electrode.

Also, the bipolar transistor with control electrode as shown in FIG. 71 must control the voltage between the control electrode and the base region so that the base region may be in a weak inversion state, and always maintain its voltage during operation. Therefore, according to the present invention a semiconductor device has been devised which needs no application of voltage between the control electrode for the bipolar transistor with control electrode and the base region.

SUMMARY OF THE INVENTION

An object of the present invention is to provide a transistor with high speed and a large current amplification factor, and a fabrication method which is highly coordinated with a MOS transistor manufacturing process.

Specifically, it is an object of the present invention to provide a semiconductor device capable of performing a low voltage operation which could not be implemented with conventional bipolar transistors through the same process as CMOS fabrication in the bipolar transistor with control electrode.

It is a second object of the present invention to allow a Bi-CMOS circuit necessary for driving a large load capacitor at a high speed to be operated at a low voltage.

It is a third object of the present invention to provide a semiconductor device which can be driven at low voltage and a fabrication method thereof in such a way as to make a transistor with control electrode of 0.3 $\mu$m or less by, for example, a micro exposure process technique of about a 1 $\mu$m rule.

It is a fourth object of the present invention to provide a bipolar transistor which is operable at a low voltage by controlling the voltage of a control electrode, and is capable of withstanding a large current, with a narrow base width and excellent high speed characteristic by forming the base region by diffusion of impurities.

It is a fifth object of the present invention to readily fabricate a bipolar transistor with control electrode in a multi-emitter structure, which is applicable for use where a large current is required.

In the light of the above objects, and as a result of research the invention as set forth below has been attained.

That is, a semiconductor device of the present invention comprising an insulating region residing adjacent to a first semiconductor region, a control electrode residing via said insulating region, a second semiconductor region and a third semiconductor region, which have an opposite conduction type to that of said first semiconductor region, residing adjacent to and carrying therebetween said first semiconductor region, characterized in that in the state where said first, second and third semiconductor regions and said control electrode are grounded, said first semiconductor region in contact with said insulating layer is adjusted to be in a weak inversion state, and the potential of said control electrode and that of said first semiconductor region are electrically coupled to be operable.

A structure may be produced in which said first, second and third semiconductor regions reside on a bulk semiconductor, and semiconductors in said first, second and third semiconductor regions are arranged in contact with one another in the order of said second, first and third semiconductor regions.

It is desirable that said first, second and third semiconductor regions reside on an insulating substrate, and said first, second and third semiconductor regions are in contact with one another in the order of said second, first and third semiconductor regions, and in contact with said insulating substrate to have a structure of a Silicon on Insulator (SOI).

Also, it is desirable to set the work function of said control electrode material, the film thickness of said insulating layer, and the impurity concentration of said semiconductor region of the first conduction type so that said first semiconductor region in contact with said insulating layer may be in a weak inversion state.

Herein, it is possible that said control electrode is gate electrode, said first semiconductor region is a channel region directly below the gate electrode, said second and third semiconductor regions are a source region and a drain region to constitute a MOS transistor.

It is desirable that said first semiconductor region in contact with said insulating layer is in weak inversion state, and a depletion layer with MOS structure reaches said insulating substrate.

Also, it is desirable to set the work function of said control electrode material, the film thickness of said insulating layer, and the impurity concentration and film thickness of said first semiconductor region so that said first semiconductor region in contact with said insulating layer may be in weak inversion state.

Also, a bipolar transistor may be constituted in such a way that said first semiconductor region is a base region, said second and third semiconductor regions are an emitter region and a collector region, respectively.

Herein, the distance from emitter junction of said base region to collector junction is desirably equal to or less than 0.3 μm.

Then, it is desirable that a bipolar transistor is constituted by forming the base region of said first semiconductor region by diffusion of impurities from the substrate surface, and forming said control electrode via an insulating film on the side of said base region.

Herein, the impurity concentration profile is said base region is desirably smaller from emitter junction to collector junction.

Also, two or more emitter regions serving as said second semiconductor region are desirably formed.

It is desirable that a thin oxide film is provided between the emitter region serving as said second semiconductor region and the emitter electrode, the conduction between said emitter region and said emitter electrode being made through the use of a tunnel current.

Then, a SOI (Silicon on Insulator) is desirably constituted with said semiconductor device made on an insulator.

the emitter region serving as said second semiconductor region is desirably constituted from a semiconductor having a larger forbidden band width than the semiconductor constituting said base region.

Herein, said semiconductor having a larger forbidden band width is desirably constituted of microcrystalline or an amorphous semiconductor.

Also, said semiconductor having a large forbidden band width is desirably constituted of SiC.

The present invention also encompasses the fabrication methods thereof. That is, the first fabrication method of the present invention is a fabrication method for a semiconductor device wherein an emitter region, a base region and a collector region are laterally formed on a SOI substrate having a semiconductor region on the surface of an insulating layer or insulator, and comprising an electrode for controlling the potential of the base region via an insulating film, characterized by including the following processes (A) to (E) which are performed in sequence:

(A) a process of forming a first insulating film region and a second insulating film region having a greater thickness than that of said first insulating film region on said semiconductor layer of the first conduction type provided on the surface of said insulating layer or said insulator, (B) a process of introducing and activating impurities of the second conduction type into said second semiconductor region below said first insulating film region with said second insulating film region as a mask, (C) a process of depositing a conduction film on said first and second insulating film regions and forming a control electrode by anisotropic etching to leave behind at least a side wall portion between said first insulating film region and said second insulating film region to be directly above the base region, (D) a process of making said emitter region and said collector region by introducing and activating impurities of the first conduction type with said control electrode and said second insulating film region as a mask, and (E) a process of electrically connecting said control electrode with a lead-out electrode of said base region.

The first fabrication method of the present invention may use a process for implanting C ions into the emitter region to constitute said emitter region of SiC.

Further, the first fabrication method of the present invention may use a process of implanting Si ions into said emitter region to constitute said emitter region of a microcrystalline semiconductor or an amorphous semiconductor.

The second fabrication method of the present invention is a fabrication method of a semiconductor device wherein an emitter region, a base region, and a collector region are vertically formed, and the conduction type of said base region is controlled via a control electrode, characterized by including at least the following processes (A) to (E) which are performed in sequence:

(A) a process of implanting impurity ions from the surface and performing heat treatment to make on a semiconductor substrate of the first conduction type, a well region of the second conduction type opposite to that of the semiconductor substrate, (B) a process of making epitaxial growth to deposit a region with a small impurity concentration of the second conduction type equal to that of said well region on said well region (the region made through this process is hereinafter abbreviated as an epitaxial region), (C) a process of implanting impurity ions of the second conduction type into a part of said epitaxial region to make said emitter region a high concentration impurity region, (D) a process of selectively removing said epitaxial region, (E) a process of depositing an insulating region on said epitaxial region, (F) a process of depositing a low resistive region on said insulating region and removing it with only the portion serving as the control electrode left behind, (G) a process of depositing a new insulating region to cover said control electrode, (H) a process of making said base region by implanting impurity ions of the first conduction type into said epitaxial region, and (J) a process of making said emitter region by implanting impurity ions of the second conduction type into said epitaxial region.

The second fabrication method of the present invention may use a process of implanting C ions in implanting impurity ions into said epitaxial region is said (J) process to constitute said emitter region of SiC to have a greater forbidden band width.

Further, the second fabrication method of the present invention may use a process of implanting Si ions and implanting impurity ions into said epitaxial region in said (J) process to constitute said emitter region of microcrystalline or amorphous Si to have a greater forbidden band width.

The second fabrication method of the present invention may include a process (K) of depositing a thin insulating film on said epitaxial region which becomes an emitter region to render the current from the emitter electrode to emitter region passing through the insulating film only a tunnel current after the (J) process.

The second fabrication method of the present invention may include a process of making a plurality of emitter regions by implanting impurity ions of the second conduction type into the plurality of regions in the process (C).

DETAILED DESCRIPTION OF THE PREFERRED EMBODIMENTS

The present invention will be described below in connection with a semiconductor device of the present invention, comprising an insulating region residing adjacent to a first semiconductor region, a control electrode residing via said insulating region, a second semiconductor region and a third semiconductor region, which have an opposite conduction type to that of said first semiconductor region, residing adjacent to and carrying therebetween said first semiconductor region, characterized in that in the state where said first, second and third semiconductor regions and said control electrode are grounded, said first semiconductor region in contact with said insulating layer is adjusted to be in weak inversion state, and the potential of said control electrode and that of said first semiconductor region are electrically couple to be operable.

According to the present invention a lateral bipolar transistor capable of turning on at low voltages is provided in such a way that a control electrode is made via an oxide film on a base region of a conventional SOI lateral bipolar transistor, and the control electrode material, the thickness of oxide film, the impurity concentration of the base region (channel region), and the oxide film are set so that the base region in contact with the oxide film may be placed in a weak inversion state, with the control electrode, an emitter and a collector of the same device being grounded, (i.e., in a sub-threshold region at a gate voltage $V_G=0$ volt, when operated as a MOS transistor with the electrodes being a gate electrode, a source, a channel, and a drain of the MOS transistor), thereby electrically coupling the base electrode with the control electrode to be operable. Herein, the sub-threshold region is defined as the region where the drain current changes exponentially when the gate voltage is changed.

Figure 1:
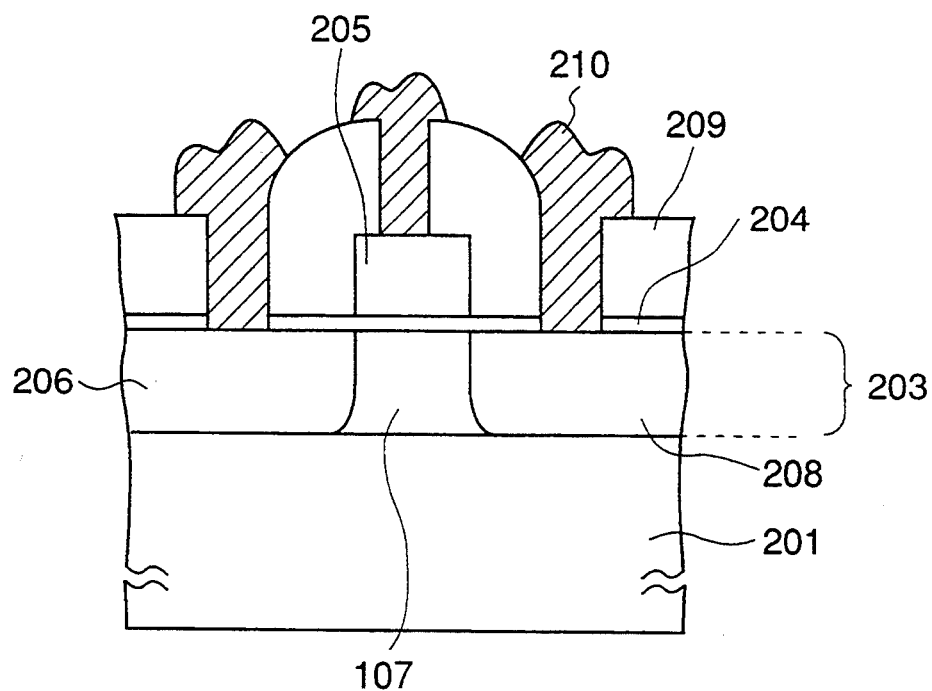
FIG. 1 is a cross-sectional view for explaining a fabrication process of semiconductor device.
Figure 2:
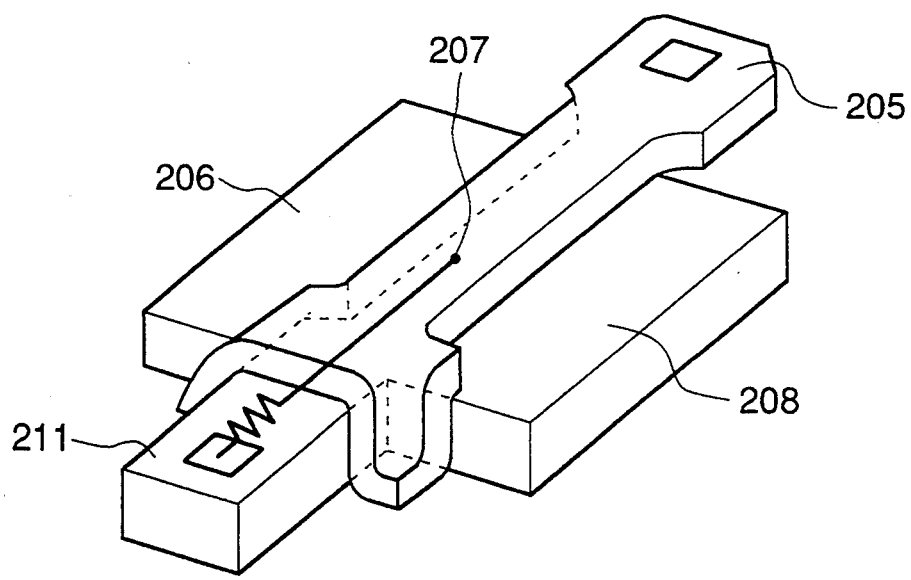
FIG. 2 is an explanation view showing a projection of a semiconductor device according to an embodiment of the present invention.
Figure 19A:
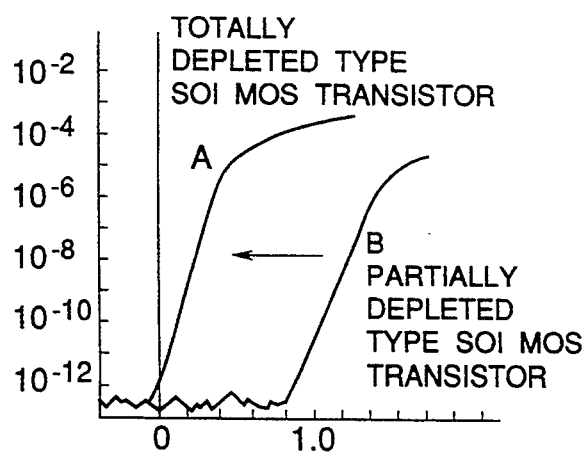
FIG. 19A and 19B are graphic representations for explaining the characteristics of the semiconductor device according to the embodiment of the present invention.
Figure 19B:
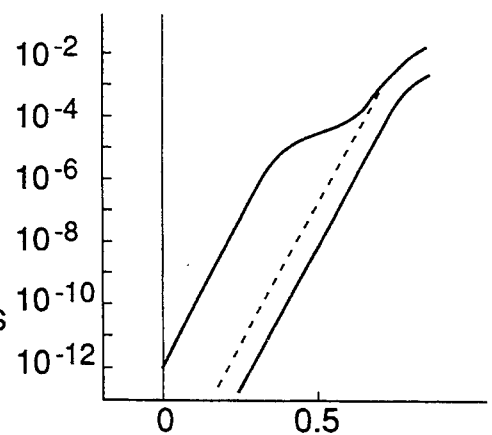

To drive the bipolar transistor at low voltages, it is effective to provide a control electrode 205 to a lateral bipolar transistor on an SOI substrate 201 as shown in FIG. 1, and to electrically connect the control electrode 205 with a base electrode 207 to effect the driving (hereinafter such device is referred to as a "lateral bipolar with control electrode"). Such lateral bipolar transistor with control electrode is of the same constitution as the MOS transistor in which the control electrode corresponds to gate electrode, and the emitter, base and collector correspond to source, channel and drain, respectively. The way of driving this lateral bipolar transistor with control electrode is adapted to the lateral bipolar transistors on bulk Si, but its detailed mechanism is not yet fully grasped. To be operable at low voltages, it is necessary to lower the voltage $V_{ON}$ required to obtain on-state current. Accordingly, it is important to make clear the operation mechanism in the low voltage region. Note that FIG. 2 is a projection view of the lateral bipolar transistor as shown in FIGS. 19A and 19B.

Figure 72:
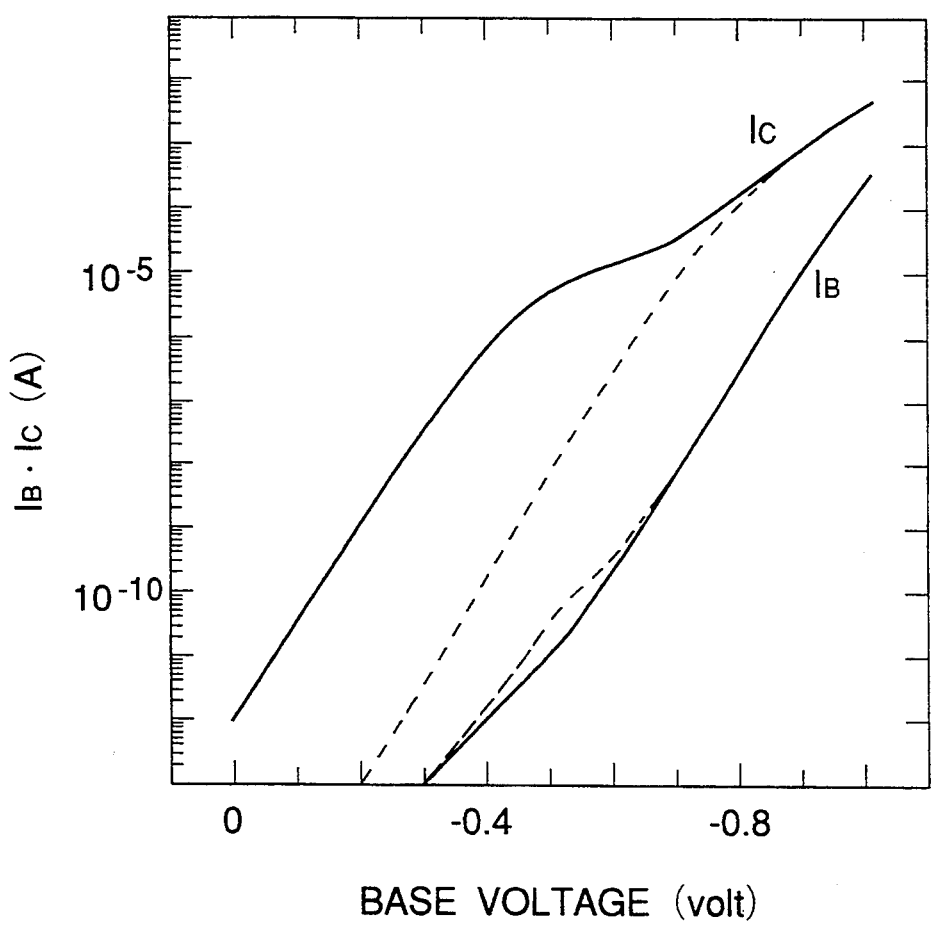
FIG. 72 is a characteristic diagram for explaining the characteristics of the lateral bipolar transistor with control electrode.

According to the present invention, it has been found, as a result of research, that the lateral bipolar transistor with control electrode can be divided into three regions in terms of the current component. Referring to FIG. 72 as previously used, its outline will be described. FIG. 72 shows the $I_C$-$V_{BE}$ characteristic of the lateral bipolar transistor with control electrode by the solid line and the characteristic of conventional lateral bipolar transistor by the broken line. Among the three regions of current characteristic, the first region is a subthreshold region of a MOS transistor for the current component, the second region is a mixture of the on=state current region of a MOS transistor and that of the lateral bipolar transistor, and the third region is a region of conventional lateral bipolar transistor for the current component.

In the case of conventional bipolar transistor, it is necessary that a high current gain ($h_{FE}$) is attained to obtain a high collector current in the low voltage region. For this purpose, there is a need for a technology capable of making a base having a thickness of several thousands angstroms. On the other hand, in the lateral bipolar transistor with control electrode, the current value in the first region is determined by the position in the sub-threshold region when the lateral bipolar transistor with control electrode, the current value in the first region is determined by the position in the sub-threshold region when the lateral bipolar transistor with control electrode is operated as the MOS transistor, whereby the collector current can be controlled by a parameter other than the base width.

Figure 3:
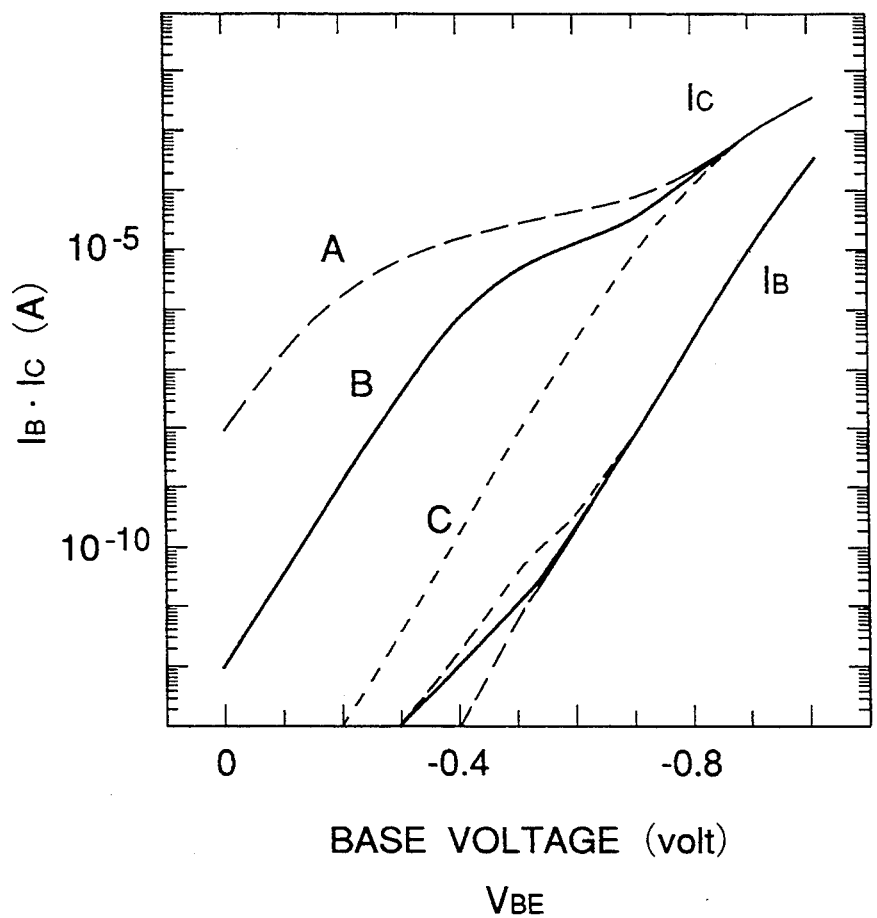
FIG. 3 is a graphic representation for explaining the comparison between the semiconductor device according to the embodiment of the present invention and a conventional semiconductor device with the gammel plot.
Figure 4:
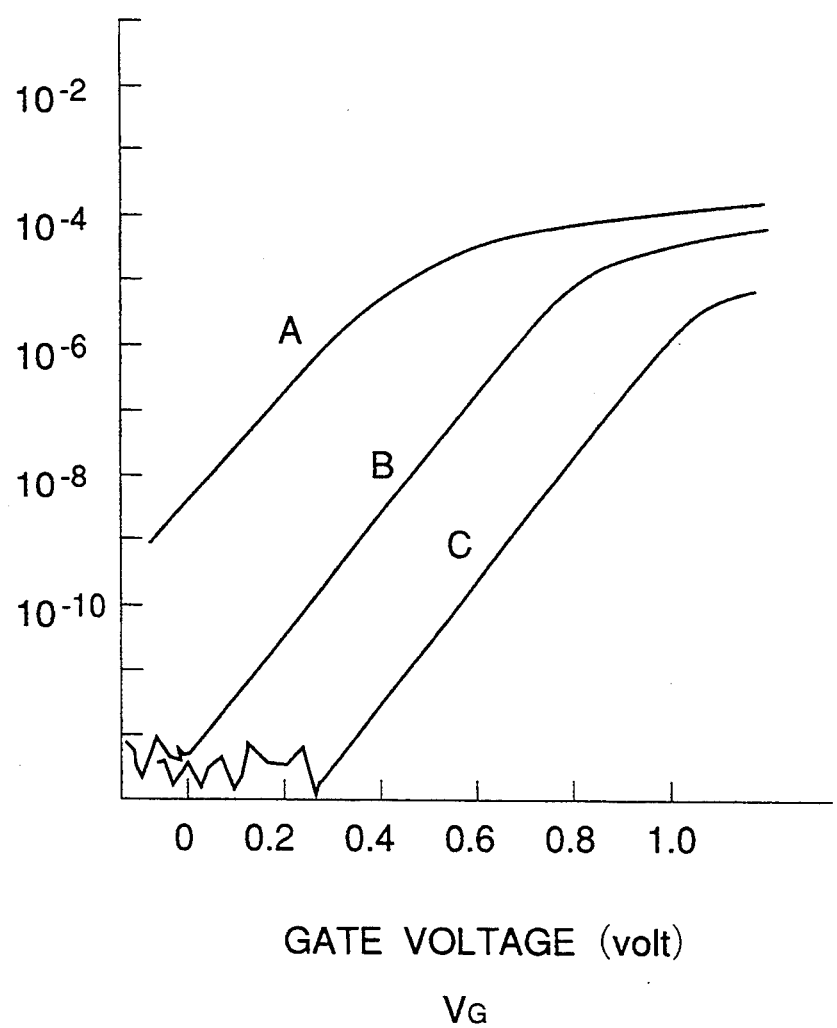
FIG. 4 is a graphic representation for explaining the comparison between the semiconductor device according to the embodiment of the present invention and the conventional semiconductor device with the gammel plot.

FIG. 3 shows the characteristic of the lateral bipolar transistor with control electrode fabricated so that the threshold voltage (in the sub-threshold region) may be different, when operated with the MOS transistor, and FIG. 4 shows the characteristic of MOS transistor. The lateral bipolar transistor with control electrode according to the present invention has the characteristic as represented by the curve B, and the conventional lateral bipolar transistor with control electrode has the characteristic as represented by the curve C. These two characteristics are compared in the following. In the curve C, the gate voltage $V_G=0$ volt is not in the sub-threshold region, while in the curve B the gate voltage $V_G=0$ volt is in the sub-threshold region. In the curve B, the collector current increases at the same time when the base voltage $V_{BE}$ becomes 0 volt or greater, whereby it can be found that the collector current reaches the on-state current (e.g., 1 μA) at a lower voltage than in the curve C. That is, the μ§ transistor in the curve B is likely to turn on, but if further shifted to the on-state side to have the gate voltage $V_G=0$ volt out of the sub-threshold region, the MOS transistor follows the curve A, whereby the collector current does not increase exponentially to have a device with smaller on/off ration.

That is, to obtain a lateral bipolar transistor with control electrode with high on/off ration and low on-state voltage, it is important that the device is designed such that the gate voltage $V_G=0$ volt may occur in the sub-threshold region when operated as the MOS transistor. Further, at which point of the subthreshold region it is set should be determined in accordance with the specification of dark current to be given to the device (current value and dispersion).

Figure 5:
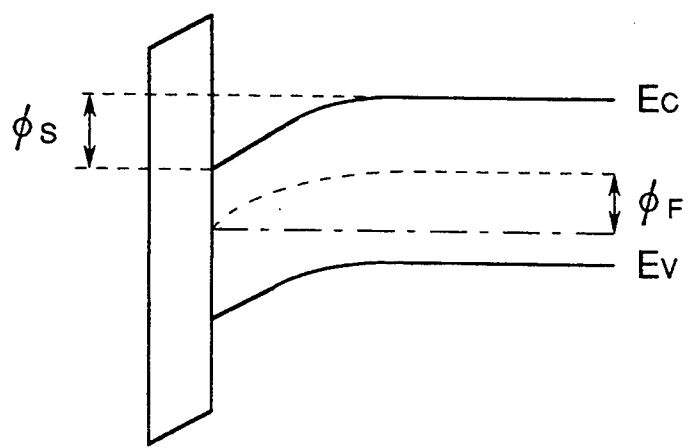
FIG. 5 is a band diagram for explaining an operation principle of the semiconductor device according to the embodiment of the present invention.

The above design items are given by the expression as follows, with reference to FIG. 5. Herein, the sub-threshold region of the MOS transistor begins upon entering the weak inversion region. That is, this occurs when the surface potential $\phi_S$ and the Fermi potential $\phi_F$ satisfy the inequality $\phi_S \geq 100 \phi_F$. Accordingly, each parameter is required to satisfy the following numerical expression 1.

$$\sqrt{2q\epsilon_S N_B \phi_F} / C_{OX} + \phi_F + \phi_{MS} \mp Q_{SS}/C_{OX} \leq 0 \tag{1}$$

where $\epsilon_S$ is a dielectric constant of silicon, $N_B$ is an impurity concentration for the base, q is a charge elementary quantity, and $\phi_F$ is a Fermi potential, given by the expression 2. $\phi_{MS}$ is the difference in work function between silicon and the gate electrode, $Q_{SS}$ is an interface charge density, and $C_{OX}$ is an insulating film capacity between the base region and control electrode. The "−" symbol indicates the NPN type while the symbol "+" indicates the PNP type. The present invention involves controlling the insulating capacity $C_{OX}$ with the thickness of oxide film and the insulating material and $\phi_{MS}$ with the substrate concentration $N_B$ and the control electrode material to satisfy the above condition. Also, when the semiconductor layer is thinner and the depletion layer spread at the gate voltage $V_G=0$ volt reaches the insulating layer for backing, such controls can be made by the thickness of semiconductor film.

$$KT/q \cdot \ln (N_B/N_i) \quad (2)$$

The semiconductor device of the present invention may be a bipolar transistor constituted such that the first semiconductor region is a base region and the second and third semiconductor regions are the emitter and collector regions, respectively, with the distance from the emitter junction of the base region to collector junction being 0.3 μm or less.

This semiconductor device can be fabricated by carrying out a fabrication method for the semiconductor device wherein an emitter region, a base region and a collector region are laterally formed on an SOI substrate having a semiconductor region on the surface of an insulating layer or insulator, and comprising an electrode for controlling the potential of the base region via an insulating film, characterized by including the following processes (A) to (E) which are performed in sequence:

(A) a process of forming a first insulating film region and a second insulating film region having a greater thickness than that of said first insulating film region on said semiconductor layer of the first conduction type provided on the surface of said insulating layer or said insulator, (B) a process of introducing and activating impurities of the second conduction type into said second semiconductor region below said first insulating film region with said second insulating film region as a mask, (C) a process of depositing a conduction film on said first and second insulating film regions and forming a control electrode by anisotropic etching to leave behind at least a side wall conduction film deposited in a stepped side wall portion between said first insulating film region and said second insulating film region to be directly above the base region, (D) a process of making said emitter region and said collector region by introducing and activation impurities of the first conduction type with said control electrode and said second insulating film region as a mask, and (E) a process of electrically connecting said control electrode with a lead-out electrode of said base region.

A fabrication method with the distance between emitter junction and collector junction being made 0.3 μm or less will be described in detail.

Figure 6:
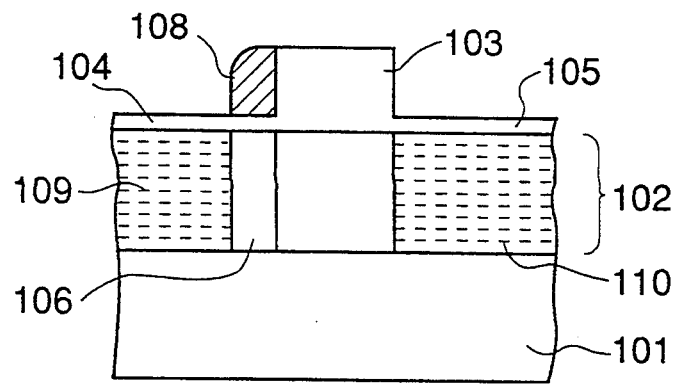
FIG. 6 is a cross-sectional view showing the constitution of a lateral bipolar transistor with control electrode fabricated by a fabrication method of the semiconductor device of the present invention.

FIG. 6 is a cross-sectional view showing the constitution of a lateral bipolar transistor with control electrode fabricated by the fabrication method of semiconductor device of the present invention, and FIGS. 7 to 12A and 12B are cross-sectional views showing the fabrication processes of the lateral bipolar transistor with control electrode by the fabrication method of semiconductor device of the present invention.

Note that an NPN-type lateral bipolar transistor with control electrode will be specifically described herein in connection with its structure and the fabrication method.

In FIG. 6, 101 is an insulating substrate, 102 is an N-type semiconductor layer, 103 is a second insulating film region having a film thickness $T_{OX2}$, 104, 105 are first insulating film regions having a film thickness $T_{OX1}$ ($T_{OX1} < T_{OX2}$), 106 is a P-type region serving as the base region, 108 is a side wall, 109, 110 are emitter regions, which are N-type high density regions serving as the collector lead-out electrode region. The lateral bipolar transistor with control electrode according to the present invention utilizes the side wall 108 as the control electrode.

Next, the fabrication method of the lateral bipolar transistor with control electrode having the above constitution will be described below.

Figure 7:
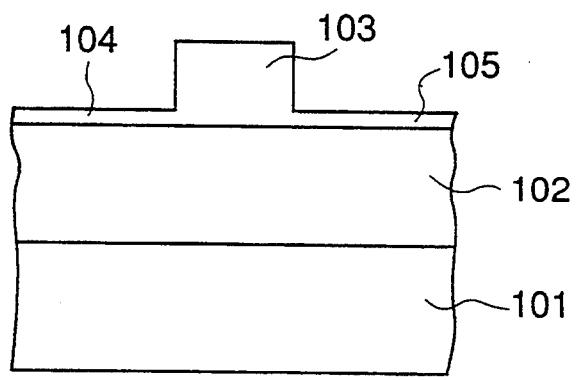
FIG. 7 is a cross-sectional view of the lateral bipolar transistor with control electrode showing a fabrication process thereof in accordance with the fabrication method of the semiconductor device of the present invention.

First, the second insulating film region 103 having a film thickness $T_{OX2}$ and the first insulating film regions 104, 105 having a film thickness $T_{OX1}$ are provided on the N-type semiconductor layer 102 on the insulating substrate 101, as shown in FIG. 7. Then, $T_{OX1}$ and $T_{OX2}$ satisfy the following relation.

$$T_{OX1} < T_{OX1}$$

Figure 8:
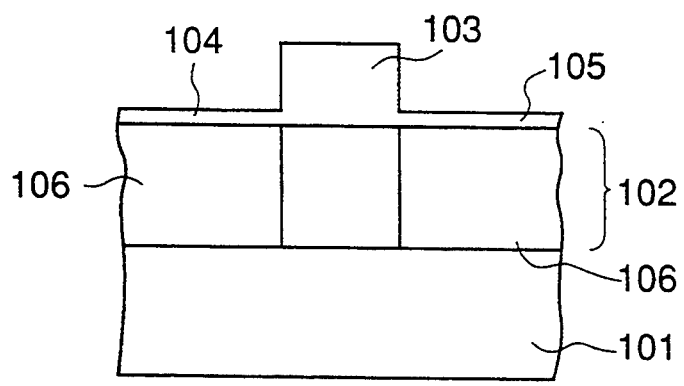
FIG. 8 is a cross-sectional view of the lateral bipolar transistor with control electrode showing a fabrication process thereof in accordance with the fabrication method of the semiconductor device of the present invention.
Figure 9:
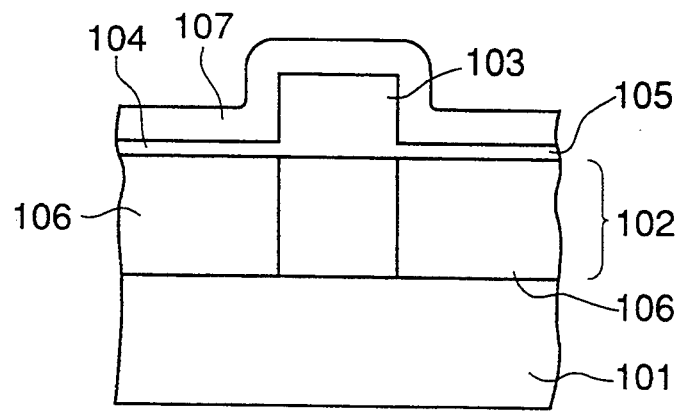
FIG. 9 is a cross-section view of the lateral bipolar transistor with control electrode showing a fabrication process thereof in accordance with the fabrication method of the semiconductor device of the present invention.

Next, ions of P-type impurity, such as boron are implanted, with the second insulating film region 103 as a mask, to form the P-type region 106, as shown in FIG. 8. Note that a part of the P-type region 106 is a base region, and this ion implantation can determine the base concentration of the lateral bipolar transistor. The concentration of P-type region 106 is preferably 1E17 $cm^{-3}$ or greater.

Figure 10:
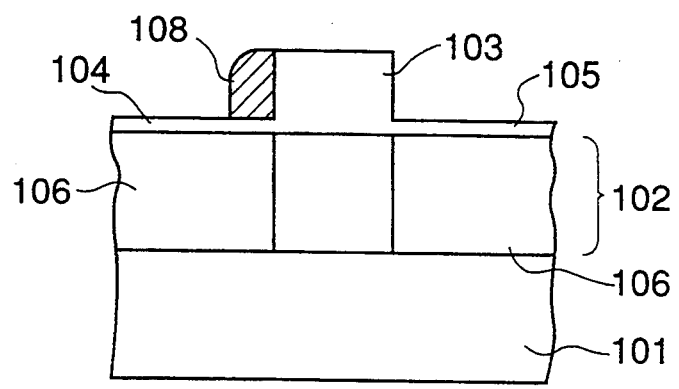
FIG. 10 is a cross-sectional view of the lateral bipolar transistor with control electrode showing a fabrication process thereof in accordance with the fabrication method of the semiconductor device of the present invention.

Thereafter, a conduction film 107 such as polycrystalline silicon of high impurity concentration is deposited (FIG. 9) to form a side wall 108 by anisotropic etching (FIG. 10). In this case, the side wall on the side of collector electrode is removed. The removal can be made by etching with a resist provided only on the base side, for example. The width of the second insulating film region 103 may be about 1 μm, and can be fully processed by exposure technique of micron order.

Figure 11:
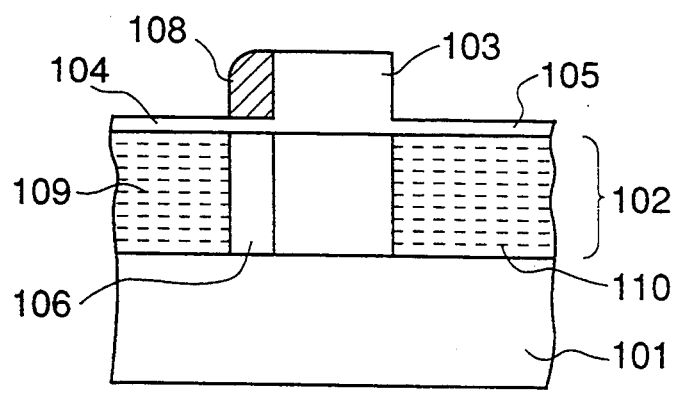
FIG. 11 is a cross-sectional view of the lateral bipolar transistor with control electrode showing a fabrication process thereof in accordance with the fabrication method of the semiconductor device of the present invention.

Then, N-type high concentration regions 109, 110 are formed by ion implantation, with the side wall 108 and the second insulating film region 103 as mask member (FIG. 11). In FIG. 11, 109 is an emitter region, 110 is a collector lead-out electrode region, and 106 is a base region. Since the base width can be determined by the width of side wall 108, the base width of 0.3 μm or less can be realized without the use of micro exposure technique. Further, since the side wall which is a control electrode is masked, the control electrode can be formed directly above the base region is self-aligned manner. As a result, the capacity between control electrode and emitter can be suppressed to a small value. Also, owing to the existence of the second insulating film region 103, the capacity with respect to the collector can be reduced.

Note that in forming the emitter region 109 by ion implantation, the emitter region may be constituted of SiC having a greater forbidden band width by implanting C ions. In this case, the emitter region may be also constituted of microcrystalline Si or amorphous Si having a great forbidden band width by implanting Si ions.

Figure 12A:
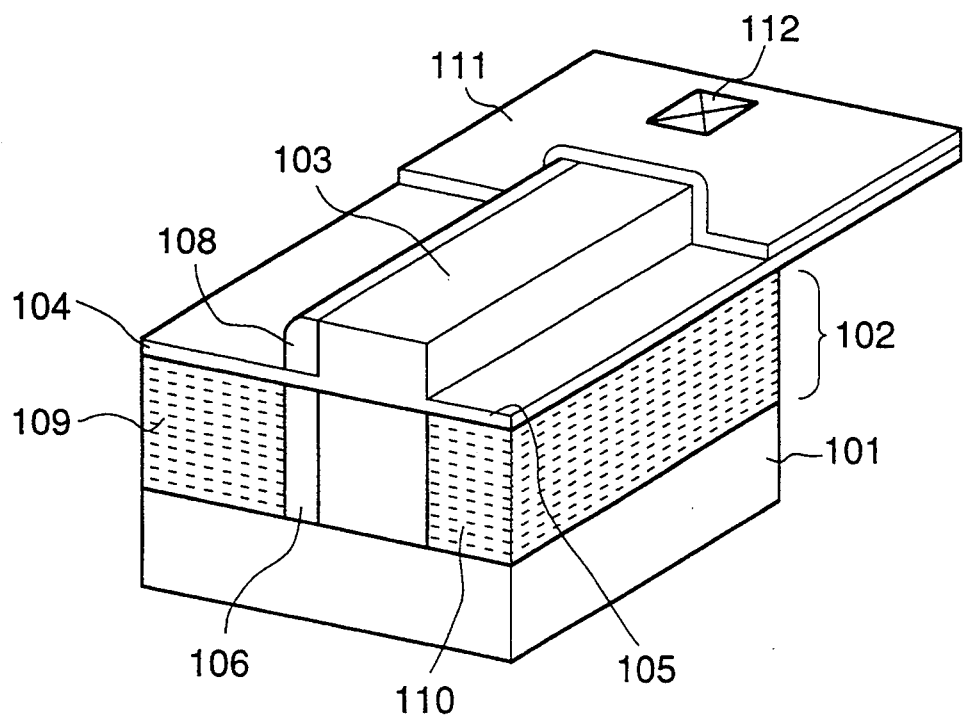
FIGS. 12A and 12B are a perspective view and a plan view of the lateral bipolar transistor with control electrode showing a fabrication process thereof in accordance with the fabrication method of the present invention.
Figure 12B:
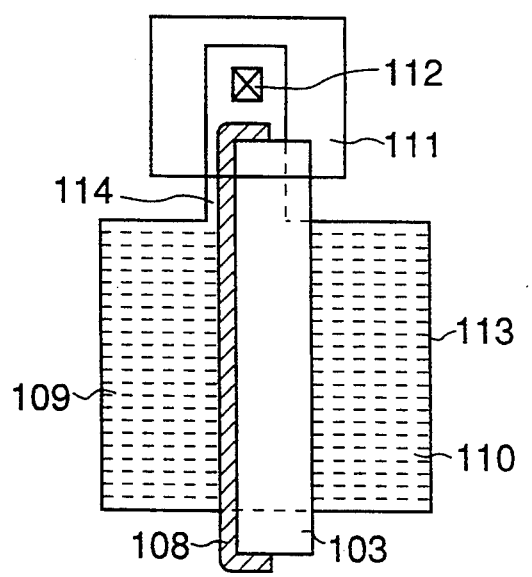

There are several possible means for electrically coupling the control electrode with the base lead-out electrode, and one such means is shown in FIGS. 12A and 12B, for example. FIG. 12A is a perspective view showing the coupled state, and FIG. 12B is a plan view. In the figure, 111 is a metallic wiring such as aluminum, 112 is a base lead-out electrode, and 113 is a border line for element separation such as an edge of selective oxide section. 114 is a region having a concentration equal to that of the base region 106, wherein the base lead-out electrode 112 resides within a high density p-type impurity region 114. Metallic film is deposited on a part of the side wall 108 to take the potential of control electrode, and the control electrode and the base lead-out electrode are connected by the same metallic film.

The present invention is to fabricate a lateral bipolar transistor with control electrode having the side wall portion as a control electrode, and a base region directly below the control electrode in self-aligned manner, with a base width of 0.3 μm or less, by including at least the above processes according to the present invention in the device fabrication process, whereby the lateral bipolar transistor with control electrode which is a low voltage, highly driving device with a base width of 0.3 μm or less can be fabricated in the inexpensive process without the use of micro exposure process technique.

Further, according to the present invention a semiconductor device has been developed comprising an insulating region residing adjacent to a first semiconductor region, a control electrode residing via said insulating region, a second semiconductor region and a third semiconductor region, which have an opposite conduction type to that of said first semiconductor region, residing adjacent to and carrying therebetween said first semiconductor region, characterized in that in the state where said first, second and third semiconductor regions and said control electrode are grounded, said first semiconductor region in contact with said insulating layer is adjusted to be in a weak inversion state, and the potential of said control electrode and that of said first semiconductor region are electrically coupled to be operable, and the base region which becomes said first semiconductor region is formed by diffusion of impurities from the substrate surface, said control electrode is formed via an insulating film on the side of said base region to constitute a bipolar transistor.

By carrying out this invention, a semiconductor device can be fabricated wherein the impurity concentration profile in said base region is smaller from emitter junction to collector junction.

Also, by carrying out this invention, two or more emitter regions serving as said second semiconductor region can be formed.

Further, by carrying out this invention, a semiconductor device can be fabricated wherein a thin oxide film is provided between the emitter region serving as said second semiconductor region and the emitter electrode, and the conduction between said emitter region and said emitter electrode is made with a tunnel current.

Also, an SOI (Silicon on Insulator) can be constituted with semiconductor device made on an insulator.

The emitter region serving as said second semiconductor region can be constituted from a semiconductor having a layer forbidden band width than the semiconductor constituting said base region.

This semiconductor device can be obtained by carrying out a fabrication method of a semiconductor device wherein an emitter region, a base region, and a collector region are vertically formed, and the conduction type of said base region is controlled via a control electrode, characterized by including at least the following processes (A) to (E) which are performed in sequence:

(A) a process of implanting impurity ions from the surface and making heat treatment to make on a semiconductor substrate of the first conduction type, a well region of the second conduction type opposite to that of the semiconductor substrate, (B) a process of making epitaxial growth to deposit a region with small impurity concentration of the second conduction type equal to that of said well region on said well region (the region made through this process is hereinafter abbreviated as a epitaxial region), (C) a process of implanting impurity ions of the second conduction type into a part of said epitaxial region to make said emitter region a high concentration impurity region, (D) a process of selectively removing said epitaxial region, (E) a process of depositing an insulating region on said epitaxial region, (F) a process of depositing a low resistive region on said insulating region and removing it with only the portion serving as a control electrode left behind, (G) a process of depositing a new insulating region to cover said control electrode, (H) a process of making said base region by implanting impurity ions the first conduction type into said epitaxial region, and (J) a process of making said emitter region by implanting impurity ions of the second conduction type into said epitaxial region.

EXAMPLE 1

Figure 13:
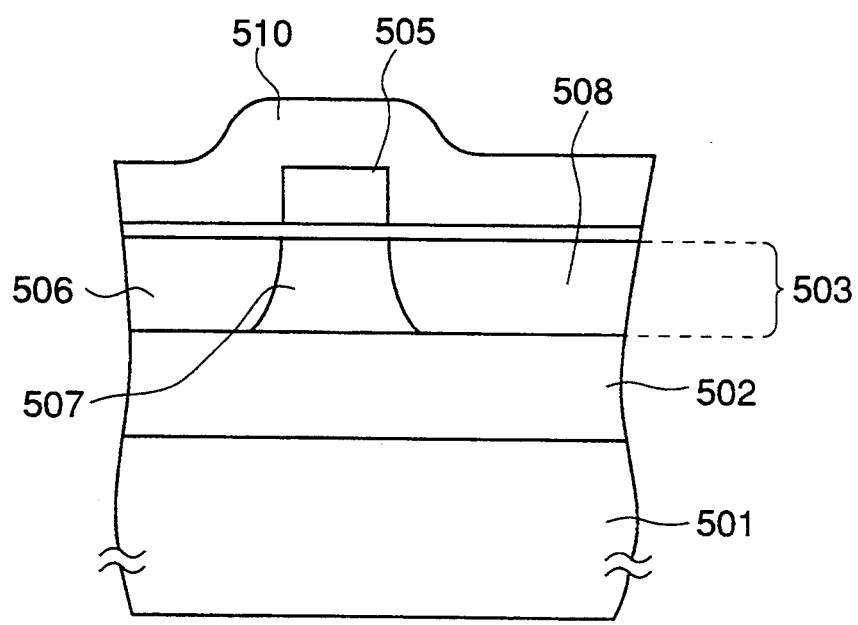
FIG. 13 is a cross-sectional view of a semiconductor device according to an embodiment of the present invention.
Figure 14:
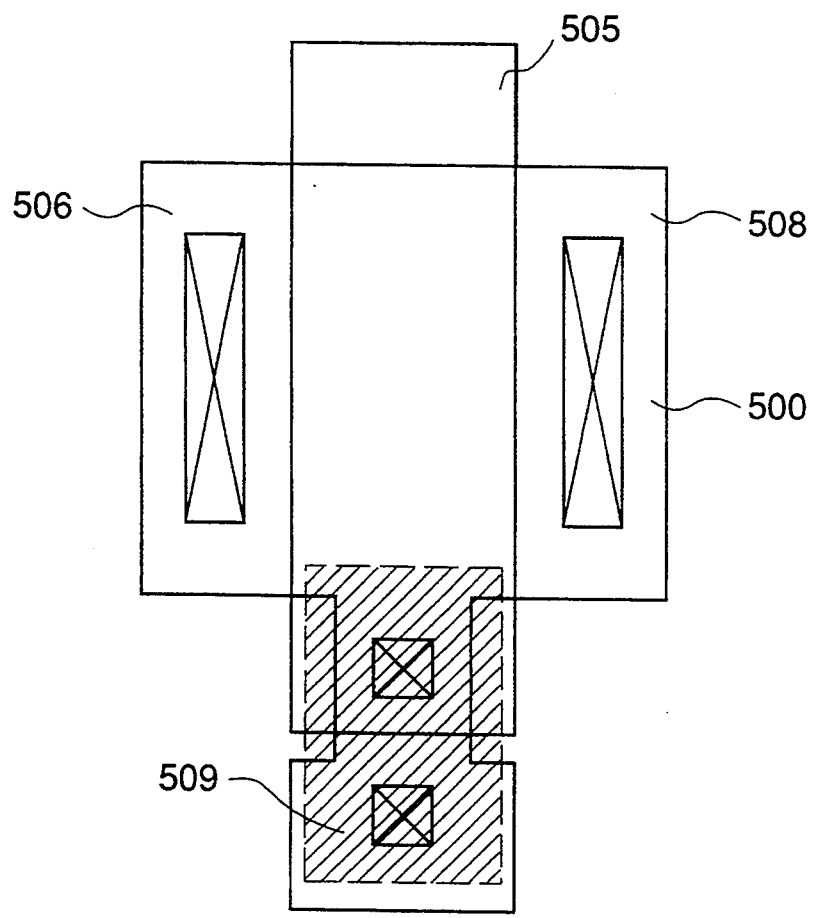
FIG. 14 is a plan view of the semiconductor device according to the embodiment of the present invention.

A semiconductor device of example 1 is shown in FIGS. 13 and 14. This semiconductor device was fabricated in the following steps (1) to (8).

(1) An SIMOX substrate 501 was used in which the thickness of an oxide film 502 for backing was 400 nm, and the thickness of a semiconductor film 503 was 500 nm.

(2) By field oxidation, an active region 500 was left behind, and the remaining semiconductor region was oxidized.

(3) Boron ions were implanted into an entire surface of the active region 500, which was then subjected to heat treatment at 1100° C. for three hours. By this process, the base density was $2 \times 10^{16}$ cm$^{-3}$.

(4) A silicon oxide film 504 having a thickness of 30 nm was formed by thermal oxidation as an insulating film between base region 507 and control region 505.

(5) An N-type polycrystalline silicon of high density was made by ion implantation after depositing polycrystalline silicon to form a control electrode 505.

(6) An emitter region 506 and a collector region 508 were formed in self-aligned manner with the control electrode 505 as a mask. In this case, the dose quantity was $2 \times 10^{15}$ cm$^{-3}$ of arsenic, and consequently, an emitter-collector region of $2 \times 10^{19}$ cm$^{-3}$ was formed. Also, to lead out the base electrode, boron ions were implanted into the lead-out portion with the same dose quantity.

(7) An interlayer insulating film was formed by depositing PSG 600 nm thick by CVD.

(8) Wiring was made to each electrode by sputtering Al-Si after opening a contact hole. In particular, a contact 509 belongs to the base electrode 507 and is connected by Al-Si with a contact of the control electrode nearby.

Figure 15A:
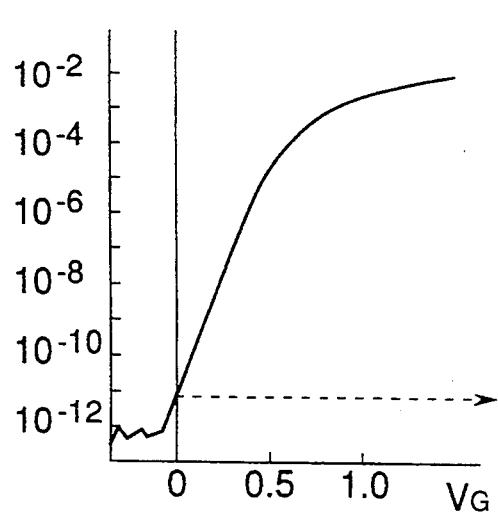
FIGS. 15A and 15B are graphic representations for explaining the characteristics of the semiconductor device according to the embodiment of the present invention.

FIG. 15A shows the characteristic of the lateral bipolar transistor with control electrode in the example 1 which is fabricated in the above manner and operated as the MOS transistor. This MOS transistor was assessed which was wired such that the base electrode and the gate electrode could be controlled independently without short-circuiting (four terminal device).

In the characteristic of MOS transistor, it will be seen that the gate voltage $V_G=0$ volt is in the subthreshold region. Since the substrate density of the base region corresponding to the channel region of MOS transistor is $2\times 10^{16}$ cm$^{-3}$, $\phi_F$ is equal to 0.386. Accordingly, the left side of the numerical expression 1 is $-0.187$ by calculation, which can satisfy the numerical expression 1 as previously given.

Figure 15B:
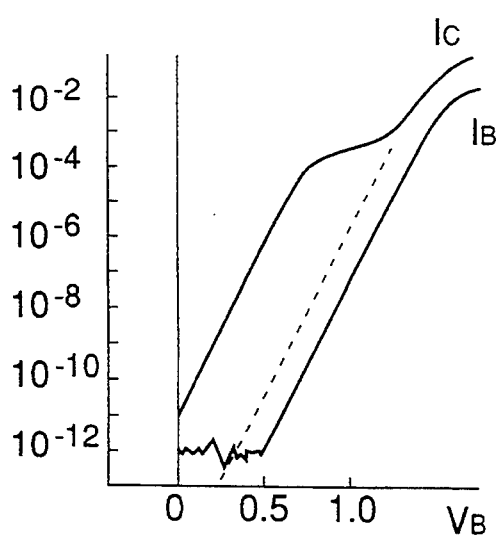

The characteristic of the lateral bipolar transistor with control electrode in the example 1 is shown in FIG. 15B. Supposing that the on-state current is 1 μA, the on-state current of the lateral bipolar transistor of this example is 0.4 volt, whereas that of conventional bipolar transistor is 0.7 volt.

Thus, the bipolar transistor having the on-state current increasing exponentially from $V_G=0$ volt with a high on/off ratio and operable at low voltages could be obtained.

EXAMPLE 2

A semiconductor device of example 2 was fabricated through the same process as in example 1, except that polycrystalline silicon was deposited on a quartz substrate, and an SOI substrate monocrystallized by laser recrystallization.

Bipolar transistor with control electrode fabricated in example 2 is a bipolar transistor which has the on-state current exponentially increasing from $V_G=0$ volt, as shown in FIG. 15B, with a high on/off ration, and is operable at low voltages.

EXAMPLE 3

Figure 16:
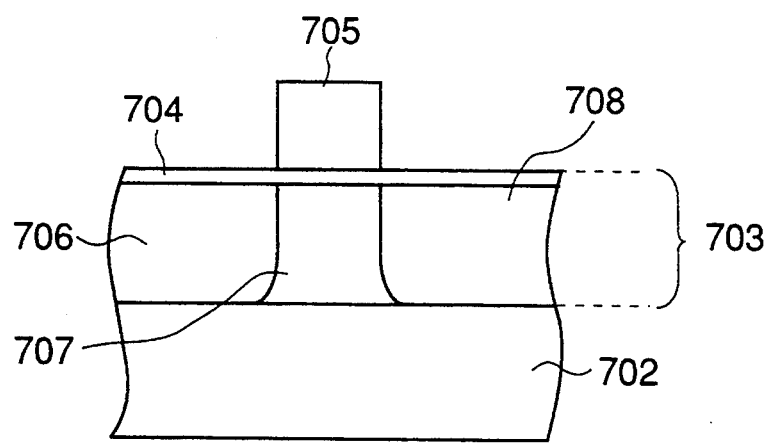
FIG. 16 is a cross-sectional view of a semiconductor device according to another embodiment of the present invention.
Figure 17:
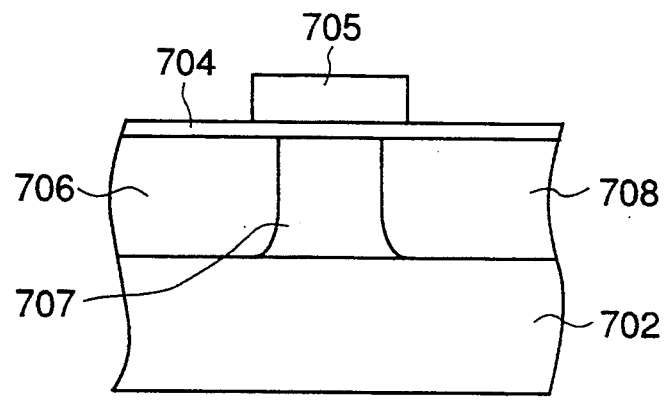
FIG. 17 is a cross-sectional view of the semiconductor device according to the embodiment of the present invention.
Figure 18:
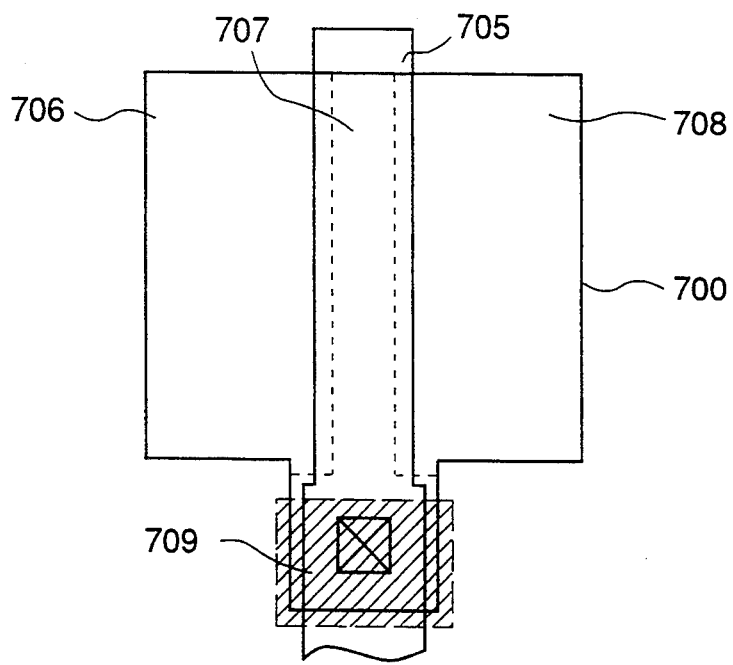
FIG. 18 is a plan view of the semiconductor device according to the embodiment of the present invention.

A semiconductor device of example 10 as shown in FIGS. 16 to 18 was fabricated through the following steps of (1) to (8).

(1) An SIMOX substrate was used in which the thickness of oxide film 702 for backing was 500 nm, and the thickness of semiconductor film 703 was 100 nm.

(2) By field oxidation, an active region 700 was left behind, and the remaining semiconductor region was oxidized.

(3) Boron ions were implanted into an entire surface of the active region 700, and heat treatment was conducted at 1100° C. for three hours. By this process, the base density was $1\times 10^{16}$ cm$^{-3}$.

(4) A silicon oxide film 704 having a thickness of 16 nm was formed by thermal oxidation method as an insulating film to be provided between base region 707 and control region 705.

(5) A mask 710 having a width of 0.2 μm was formed by EB exposure and with a multi-layer resist.

(6) An emitter region 706 and a collector region 708 were formed using a mask 710 having a width of 0.2 μm and by ion implantation. In this case, the dose quantity was $2\times 10^{15}$ cm$^{-3}$ of arsenic, and consequently, an emitter-collector region of $2\times 10^{19}$ cm$^{-3}$ was formed. Also, a base lead-output portion was subjected to implantation of boron ions with the same dose quantity.

(7) A contact hole was directly formed without providing an interlayer insulating film.

(8) Yttrium Y deposited by EB vapor deposition and patterning was made for wiring to provide a control electrode 705.

Herein, the work function of yttrium is 3.15 eV, and the difference in work function between it and p-type silicon having a concentration of $1\times 10^{16}$ cm$^{-3}$ is 1.9 eV.

To realize a bipolar transistor having a high cut-off frequency, it is necessary to form the transistor having a small base width. In recent years, the improved exposure technology permits the processing of as small as 0.2 μm, as in this example. If the base width is reduced, the concentration must be increased to about $10^{16}$ cm$^{-3}$ to suppress the punch-through from emitter to collector. As a result, in the lateral bipolar transistor with control electrode, the threshold voltage of MOS transistor having the base region as the channel rises, and it is quite difficult to have $V_G=0$ within the sub-threshold region in the N-type polycrystalline silicon having conventional gate electrode material. The threshold voltage can be lowered by reducing the thickness of oxide film, in which case the oxide film thickness is required to be reduced to about 8 nm, giving rise to a problem in the reliability of the oxide film.

Also, when the base concentration is high, the oxide film thickness can be increased to 16 nm by using a material having a small work function such as yttrium, whereby a high speed bipolar transistor can be provided with the reliability of the oxide film maintained. In this example, yttrium was used, but besides, strontium, lanthanum, and cesium can be employed.

EXAMPLE 4

A lateral bipolar transistor with control electrode, i.e., a semiconductor device of example 4, was fabricated through exactly the same process as in example 1 (FIGS. 13 and 14), except that SIMOX substrate used comprised the oxide film for backing having a thickness of 500 nm and the semiconductor film having a thickness of 50 nm, and the base concentration was set at $2\times 10^{-17}$ cm$^{-6}$ in the above process (3).

In this example, the maximum width of depletion layer in base region formed by the MOS structure having a control electrode 505, an insulating film 504 and a base region 507 is 75 nm. And the depletion layer width when the sub-threshold region begins is 53 nm. In this case, the MOS transistor is operable with the semiconductor film in a totally depleted state. The threshold voltage of MOS transistor in such totally depleted state is lower than that of MOS transistor formed at the same channel density on the build silicon. This behavior is shown in FIGS. 19A and 19B. Curve A of FIG. 19A shows the characteristic when the lateral bipolar transistor with control electrode of example 4 is operated as the MOS transistor, and curve B shows the characteristic of the same channel density.

FIG. 19B shows the characteristic when these two devices are operated as the lateral bipolar transistor with control electrode. Herein, curve A and curve B show the characteristic of device on the bulk silicon for the example 4 and the comparison, respectively. The device in example 4 has the current value exponentially increasing simultaneously when the voltage is input, while device on the bulk silicon can not obtain the same collector current unless about 0.2 volt is applied in excess.

This device is one in which $V^G=0$ is not within the sub-threshold region by controlling the position of the sub-threshold region only with the oxide film thickness and the base density as was conventionally performed, but this example is designed such that by reducing the semiconductor film thickness of SOI below the maximum depletion layer width to lower the threshold voltage, $V_G=0$ volt is within the sub-threshold region. As a result, the lateral bipolar transistor with control electrode can be provided in the high density base only by the material used in the conventional silicon process.

EXAMPLE 5

An example 5 will be described using FIGS. 20 to 25. This example was fabricated through the following steps of (1) to (14).

(1) A silicon wafer 901 made of bulk silicon was used.

Figure 20:
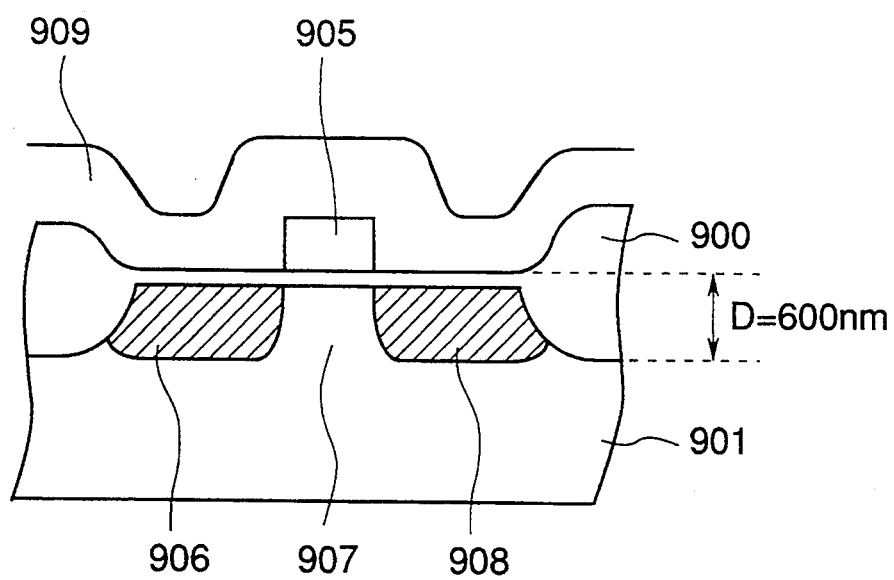
FIG. 20 is an explanation view of the fabrication process of a semiconductor device according to the embodiment of the present invention.

(2) Field oxidation was conducted to have D in FIG. 20 equal to 600 nm to form a field oxide film 900.

(3) Boron ions were implanted into an entire surface and heat treatment was conducted at 1100° C. for three hours. By this process, the base density was $1 \times 10^{16} cm^{-3}$.

(4) A silicon oxide film 904 having a thickness of 30 nm was formed by thermal oxidation method as an insulating film to be provided between base region 907 and control region 905.

(5) After depositing polycrystalline silicon, high density N-type polycrystalline silicon was made by ion implantation to form a control electrode 905.

(6) An emitter region 9006 and a collector region 908 were formed in self-aligned manner with the control electrode 905 masked and by ion implantation. In this case, the dose quantity was $2 \times 10^{16} cm^{-3}$ of arsenic, and consequently, an emitter-collector region of $2 \times 10^{19} cm^{-3}$ was formed. Finally, the depth of junction was 600 nm.

(7) PSG was deposited 600 nm thick by CVD to form an interlayer insulating film 909.

Figure 21:
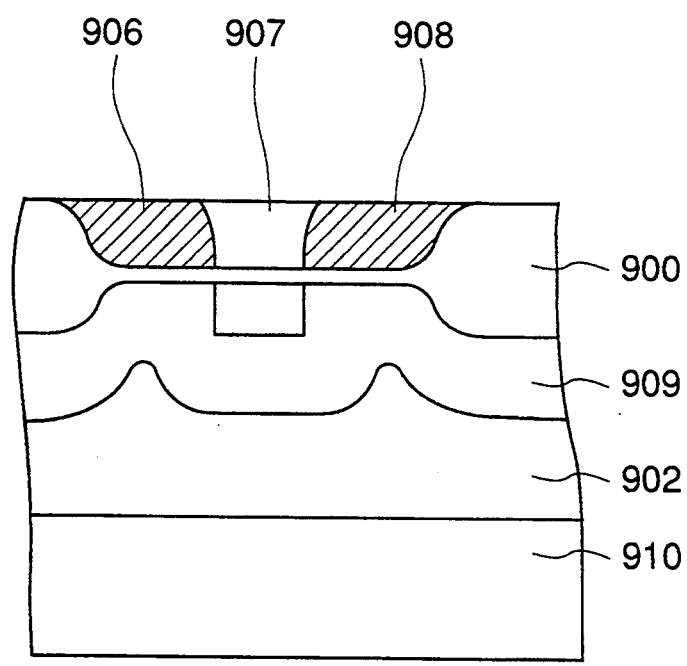
FIG. 21 is an explanation view of the fabrication process of semiconductor device according to the embodiment of the present invention.
Figure 22:
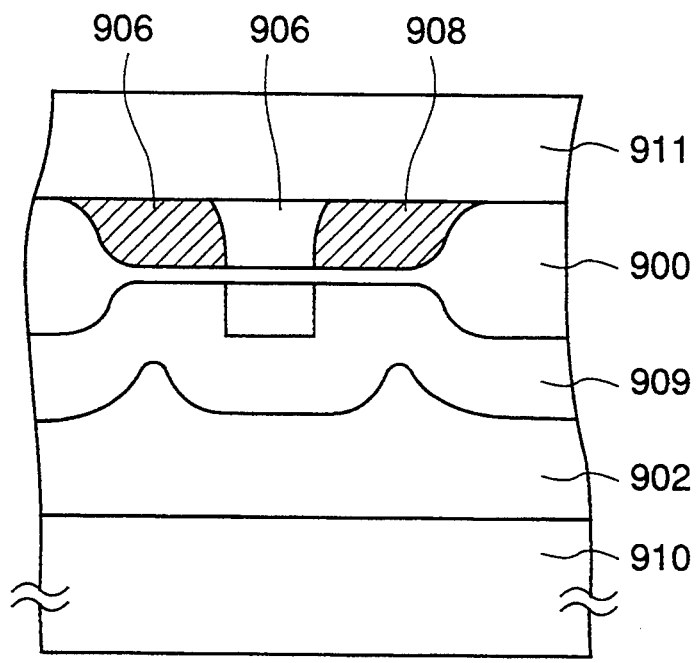
FIG. 22 is an explanation view of the fabrication process of semiconductor device according to the embodiment of the present invention.
Figure 23:
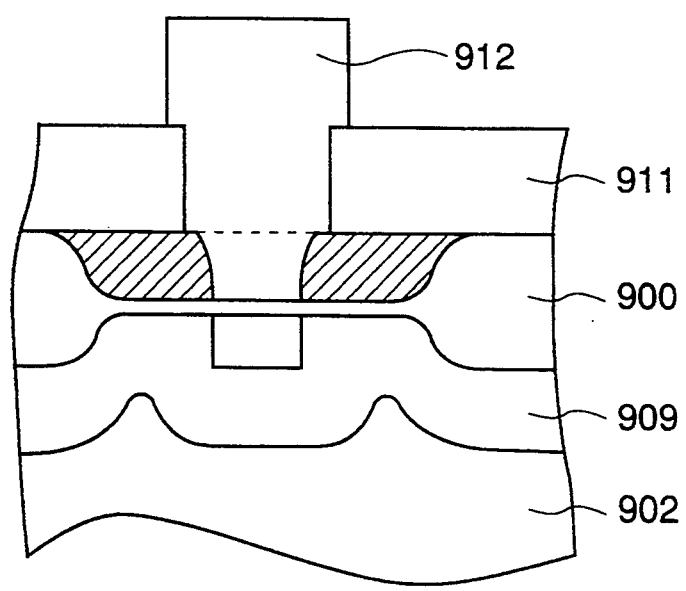
FIG. 23 is an explanation view of the fabrication process of semiconductor device according to the embodiment of the present invention.
Figure 24:
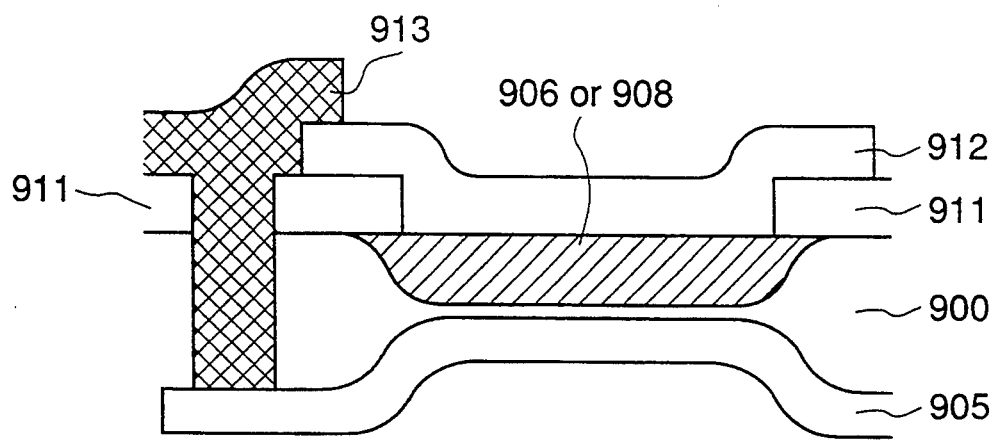
FIG. 24 is an explanation view of the fabrication process of semiconductor device according to the embodiment of the present invention.
Figure 25:
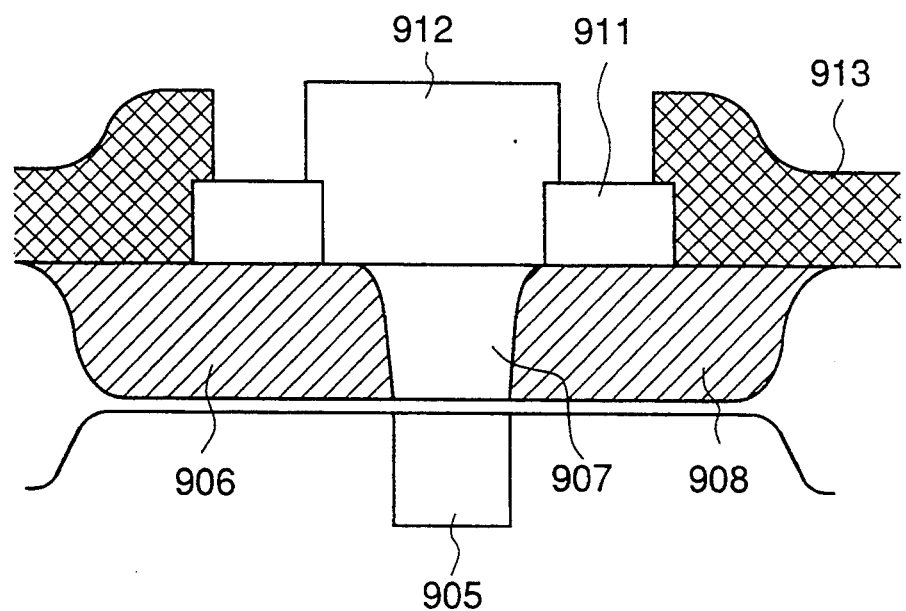
FIG. 25 is an explanation view of the fabrication process of semiconductor device according to the embodiment of the present invention.
Figure 26:
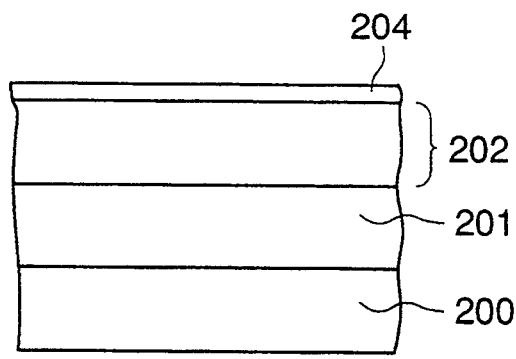
FIG. 26 is a cross-sectional view showing the fabrication process of an embodiment in accordance with the fabrication method of the semiconductor device of the present invention.

(8) A silicon wafer was adhered to a support substrate 910 by using a polyamide adhesive 902 as shown in FIG. 21.

(9) Bulk silicon was selectively etched, using an amine type etching solution and the field oxide film 900 as the stopper.

(10) A silicon oxide film 911 was deposited at low temperature by photo assisted CVD.

(11) The base portion was only opened by mask alignment method, p-type polycrystalline silicon 912 was deposited in an amount of $2 \times 10^{19}$ cm$^{-3}$, and was subjected to heat treatment for the recrystallization with monocrystalline silicon of the base region 907 as the seed. Herein, the mask alignment method is to provide a mask in accordance width an alignment mark, while viewing the alignment mark provided on the side of the control electrode 905 through the silicon film thickness of about 500 to 600 nm. By recrystallizing the type polycrystalline silicon of $2 \times 10^{19}$ cm$^{-3}$, the short-circuit between emitter/collector and base was suppressed to eliminate the area of life time killer such as polycrystalline silicon from the side of the base region. As a result of the structure as presented in FIG. 23, the lateral bipolar transistor without external base was produced.

(12) A through hole 913 was provided to take out the potential of control electrode 905.

(13) A contract 914 was provided to take out the emitter-collector potential for the interlayer insulating film.

(14) The control electrode 905 and the base electrode 912 were connected by Al-Si and other wiring for emitter-collector were made.

In the above way, a device equivalent to that as shown in FIG. 1 was fabricated. Also, as a result of the structure of example 5, the base resistance could be decreased, and the high collector current could be obtained even in the high current area.

EXAMPLE 6

The same process as example 1 was performed using an N-type SIMOX substrate of 10 to 20Ω. However, a PNP-type bipolar transistor with control electrode was also fabricated in example 6. That is, in the PNP-type bipolar transistor with control electrode, an emitter/collector region was made at the time of ion implantation of boron for leading out of the base, and an N+ region for leading out the base was made at the time of ion implantation of arsenic for the formation of the NPN-type emitter/collector.

Figure 57:
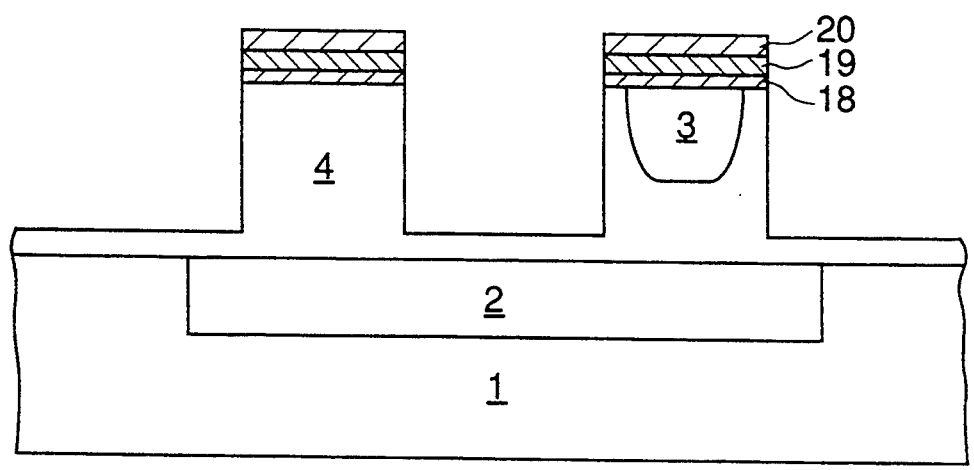
FIG. 57 is a cross-section view for explaining the fabrication method of the bipolar transistor as shown in FIGS. 55 and 56.

Further, a Bi-CMOS transistor with a circuit as shown in FIG. 57 was fabricated by using a device formed on the substrate of example 1, having the base electrode as a substrate contact for the MOS transistor without short-circuiting the base electrode and the control electrode, and the control electrode as the gate electrode for the MOS transistor. Of course, the transistor as shown in the circuit diagram is a lateral bipolar transistor with control electrode.

Figure 58:
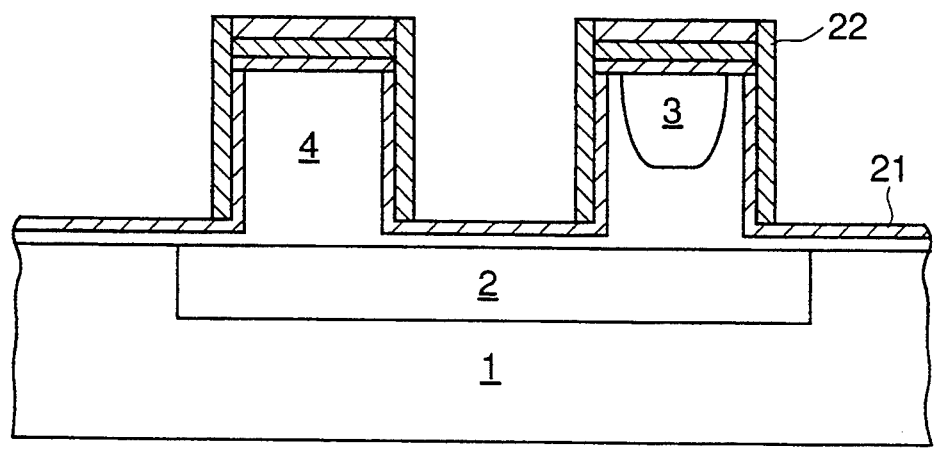
FIG. 58 is a cross-section view for explaining the fabrication method of the bipolar transistor as shown in FIGS. 55 and 56.

FIG. 58 shows an output diagram of the Bi-CMOS inverter. The output voltage at high level is lower by 0.45 volt than the voltage value of the power supply, and that at low level is high by 0.45 volt than the ground voltage. For the comparison, the evaluation with the conventional bipolar transistor indicated that this value was 0.65 volt but not 0.45 volt.

And the minimum drive voltage of Bi-CMOS using the conventional bipolar transistor was 1.5 volt, whereas that of the lateral bipolar transistor with control electrode of the present invention was 1.1 volt. Hence, with the example 6, Bi-CMOS circuit could be fabricated, with which a device fully drivable by a single cell can fabricated through a simple process of the conventional CMOS process.

EXAMPLE 7

This example will be described below using FIGS. 26 to 37.

Figure 27:
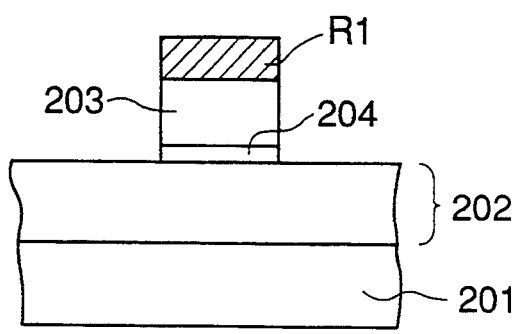
FIG. 27 is a cross-sectional view showing the fabrication process of an embodiment in accordance with the fabrication method of the semiconductor device of the present invention.
Figure 28:
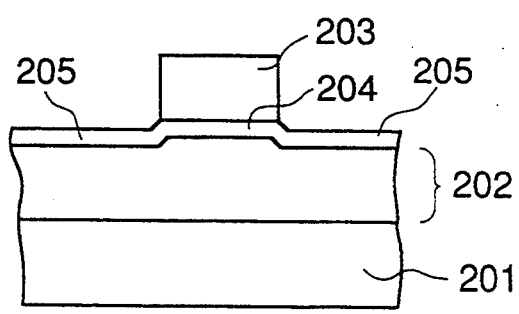
FIG. 28 is a cross-sectional view showing the fabrication process of the embodiment in accordance with the fabrication method of the semiconductor device of the present invention.

Thirst, complete dielectric separation between elements was performed by a separation method of selective oxidation for an SIMOX substrate in which the film thickness of silicon oxide film for backing 201 on a silicon substrate 200 was 400 nm and the film thickness of a silicon layer 202 was 200 nm, with the substrate density of 2E15 cm$^{-3}$. Then, a thermal oxide film 204 having a film thickness of 10 nm NSG film 203 was deposited 500 nm thick, and removed partially (FIG. 27). R1 in FIG. 27 indicates a resist film. In the figure, the width of the second insulating film region 203 was about 1 μm. After the resist film R1 was removed, thermal oxidation was performed again to form a 10 nm-thick silicon oxide film (FIG. 28). In FIG. 28, 205 is a first insulating film region (with a thickness of $T_{OX1}$) and the NSG film 203 plus thermal oxide film 204 is a second insulating film region (with a thickness of $T_{OX2}$). In this case, $T_{OX1}$ is equal to 10$^-$ nm and $T_{OX2}$ is equal to 510 nm, where $T_{OX1} < T_{OX2}$.

Figure 29:
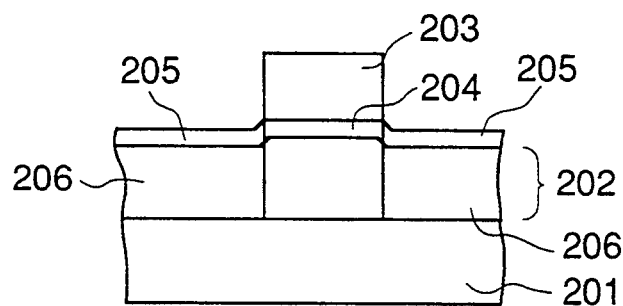
FIG. 29 is a cross-sectional view showing the fabrication process of the embodiment in accordance with the fabrication method of the semiconductor device of the present invention.

As shown in FIG. 29, ion implantation of boron was performed with the second insulating film region (203+204) masked to form a P-type impurity region 206 corresponding to the base density. The conditions of ion implantation were such that the ion species was B$^{11+}$, the implantation energy was 70 KeV and the dose quantity was 5E12 cm$^{-2}$. As a result, the impurity density of the P-type region 206 was equal to 4E17 cm$^{-3}$.

Figure 30:
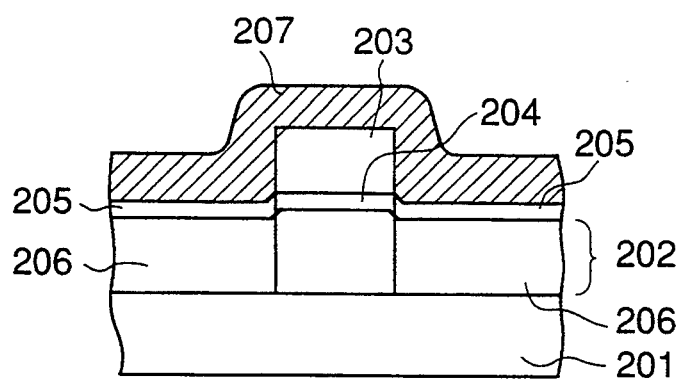
FIG. 30 is a cross-sectional view showing the fabrication process of the embodiment in accordance with the fabrication method of a semiconductor device of the present invention.
Figure 31:
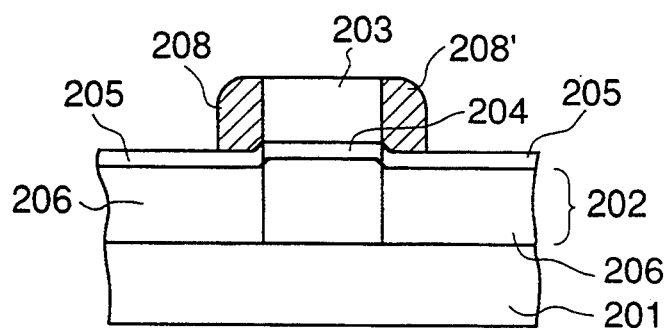
FIG. 31 is a cross-sectional view showing the fabrication process of the embodiment in accordance with the fabrication method of the semiconductor device of the present invention.
Figure 32:
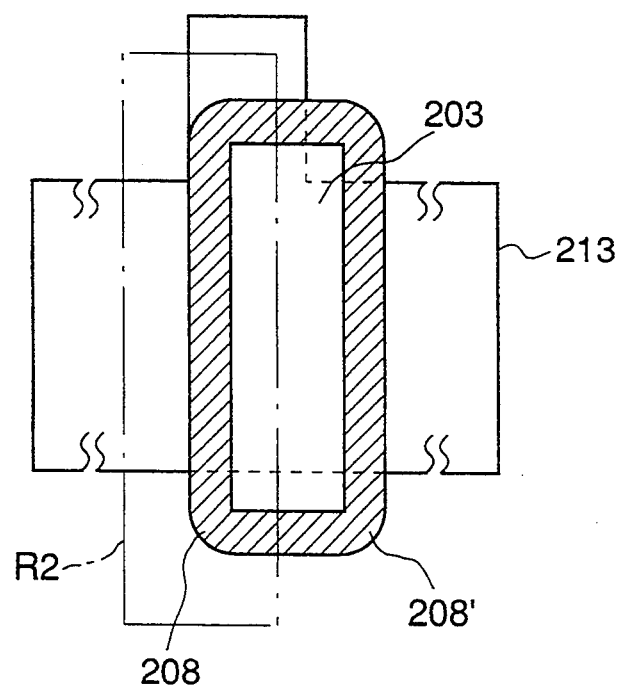
FIG. 32 is a plan view showing the fabrication process of the embodiment in accordance with the fabrication method of the semiconductor device of the present invention.
Figure 33:
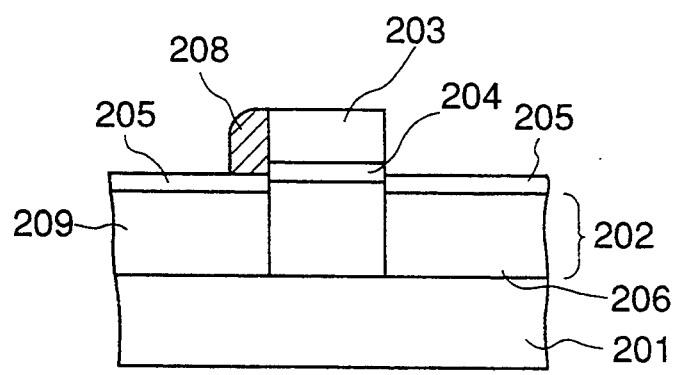
FIG. 33 is a cross-sectional view showing the fabrication process of the embodiment in accordance with the fabrication method of the semiconductor device of the present invention.

Then, a 400 nm-thick polycrystalline silicon film was deposited as shown in FIG. 30, and ion implantation of phosphorus was performed with a dose quantity of 8E15 cm$^{-2}$ and an implantation energy of 70 KeV to form a polycrystalline silicon conductive film 207. Side walls 208, 208' were then formed by anisotropic etching, with only the polycrystalline silicon on the side wall portion left behind (FIG. 31). Thereafter, a side wall 208 on the base portion was covered with a resist R2, as shown in FIG. 32, and a side wall 208' on the side of collector electrode was removed to form a structure as shown in FIG. 33. In FIG. 32, 213 is a selective oxide portion edge. In this case, the thickness of side wall was found to be about 260 nm from the SEM observation.

Figure 34:
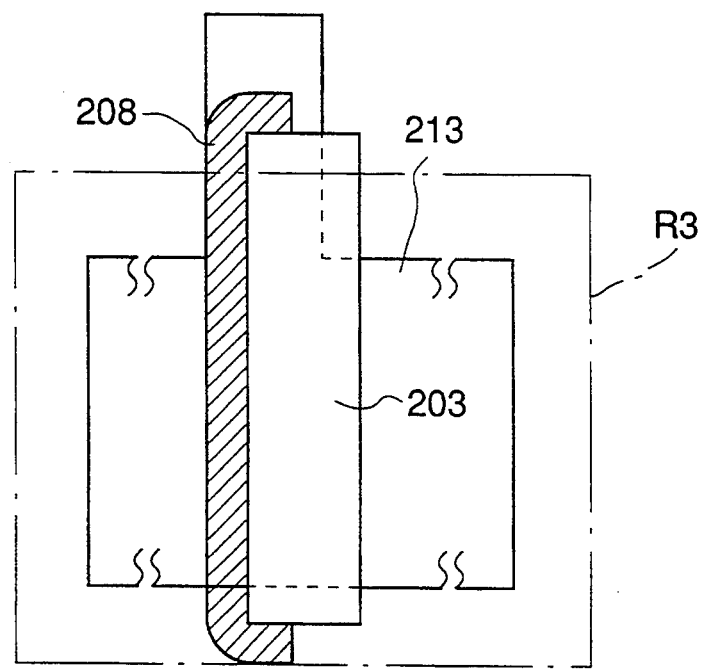
FIG. 34 is a plan view showing the fabrication process of the embodiment in accordance with the fabrication method of the semiconductor device of the present invention.
Figure 35:
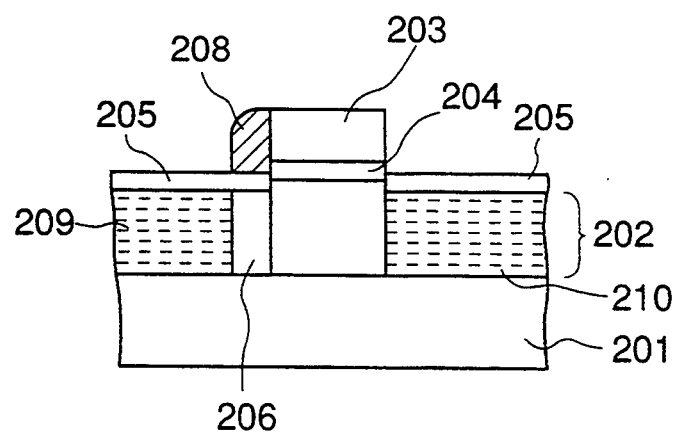
FIG. 35 is a cross-sectional view showing the fabrication process of the embodiment in accordance with the fabrication method of the semiconductor device of the present invention.
Figure 36:
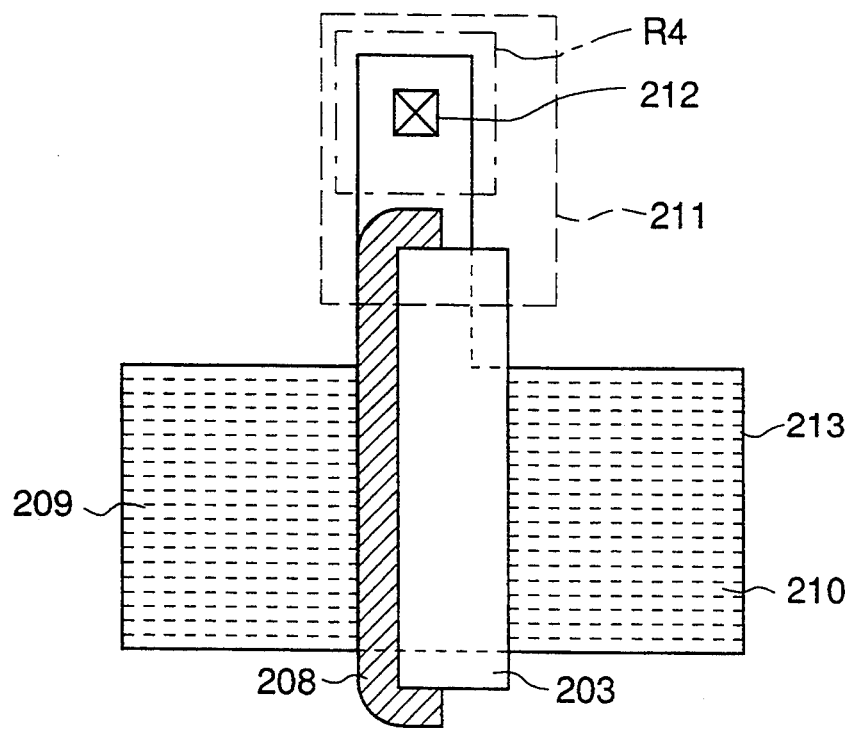
FIG. 36 is a plan view showing the fabrication process of the embodiment in accordance with the fabrication method of the semiconductor device of the present invention.

Then, an element portion was opened with a resist R3, as shown in FIG. 34, and ion implantation was conducted into the emitter/collector electrode with the side wall 208 and the second insulating film region 203 masked. The conditions of ion implantation were such that the ion species was As, the implantation energy was 150 KeV and the dose quantity was 5E15 cm$^{-2}$. Also, to form a base electrode, a resist R4 was applied, except for a part of the base region to be opened, as shown in FIG. 36, and ion implantation was conducted under the conditions with the implantation energy of 20 KeV and the dose quantity of 1E15 cm$^{-2}$. After ion implantation, heat treatment was conducted in a nitrogen atmosphere at 1000° C. for ten minutes to activate impurities. consequently, a structure as shown in FIG. 35 was formed. In the figure, a P-type impurity region 206 was a base region, high density N-type impurity region 206 was a base region, high density N-type impurity region 20-9 was an emitter region, and high density N-type impurity region 210 was a collector lead-out electrode region. The base width is determined by the thickness of side wall, and was about 260 nm in this example.

Figure 37:
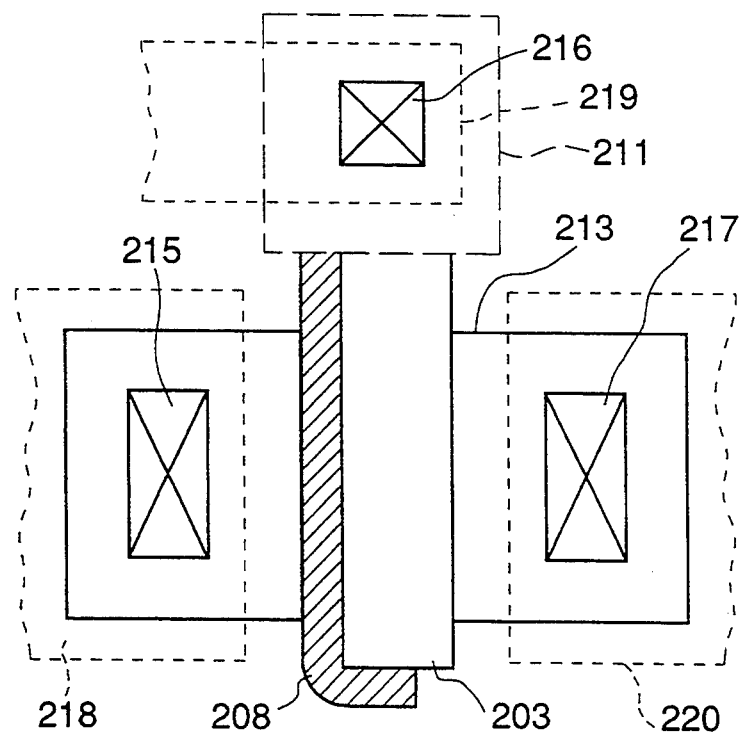
FIG. 37 is a plan view showing the fabrication process of the embodiment in accordance with the fabrication method of the semiconductor device of the present invention.

Then, to electrically couple the control electrode and the base lead-out electrode, a contact 212 for the base lead-out electrode was opened. After Al was deposited by sputtering, an Al wiring 211 was formed to cover the base lead-out electrode 212 and the side wall 208, as shown in FIG. 36. After PSG was deposited 500 nm thick as an interlayer insulating film, a contact hole was opened to lead out each of emitter, base and collector electrodes, Al was deposited 800 nm thick as the second layer by sputtering, and the patterning was made to form electrodes and the wiring. FIG. 37 is a plan view. In the figure, 215, 216 and 217 are contact holes for emitter, base and collector electrodes, respectively, and 218, 219 and 220 are Al wiring on the second layer for emitter, base and collector electrodes.

EXAMPLE 8

This example will be described below using FIGS. 38 to 42.

Figure 38:
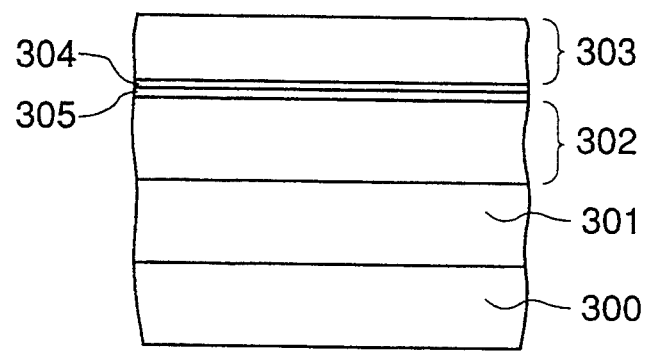
FIG. 38 is a cross-sectional view showing the fabrication process of another embodiment in accordance with the fabrication method of the semiconductor device of the present invention.
Figure 39:
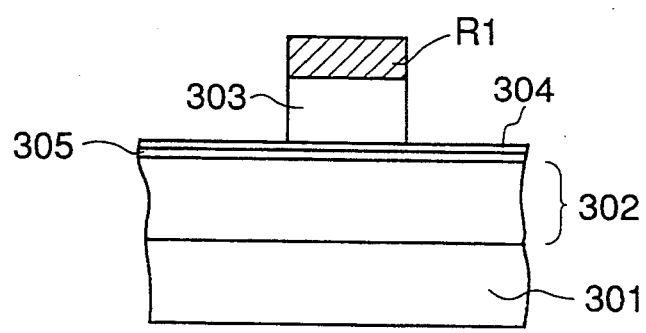
FIG. 39 is a cross-sectional view showing the fabrication process of the embodiment in accordance with the fabrication method of the semiconductor device of the present invention.
Figure 40:
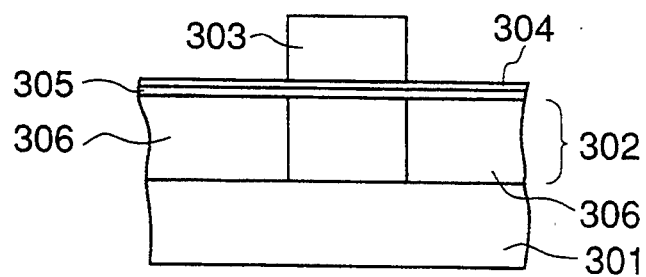
FIG. 40 is a cross-sectional view showing the fabrication process of the embodiment in accordance with the fabrication method of the semiconductor device of the present invention.

First, complete dielectric separation between elements was performed by a separation method of selective oxidation for an SIMOX substrate in which the film thickness of a silicon oxide film for backing 301 on a silicon substrate 300 was 400 nm and the film thickness of silicon layer 302 was 200 nm, with the substrate density of 2E15 cm$^{-3}$. Then, a thermal oxide film 305 having a film thickness of 10 nm was formed on this substrate, a silicon nitride film 304 was deposited 10 nm thick thereon, and further an NSG film 303 was deposited 500 nm thick thereon (FIG. 38). The NSG film 303 was removed partially to provide a second insulation film region 303 (FIG. 39). In the same figure, R1 indicates a resist film, and the width of second insulation film region 303 was about 1 μm. After the resist film R1 was removed, ion implantation of boron was conducted with the second insulating film region 303 as a mask to form a P-type impurity region 306 corresponding to the base density.

Figure 41:
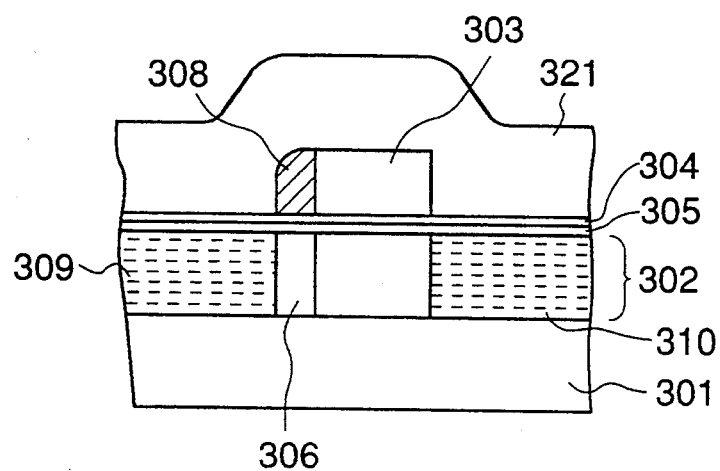
FIG. 41 is a cross-sectional view showing the fabrication process of the embodiment in accordance with the fabrication method of the semiconductor device of the present invention.
Figure 42:
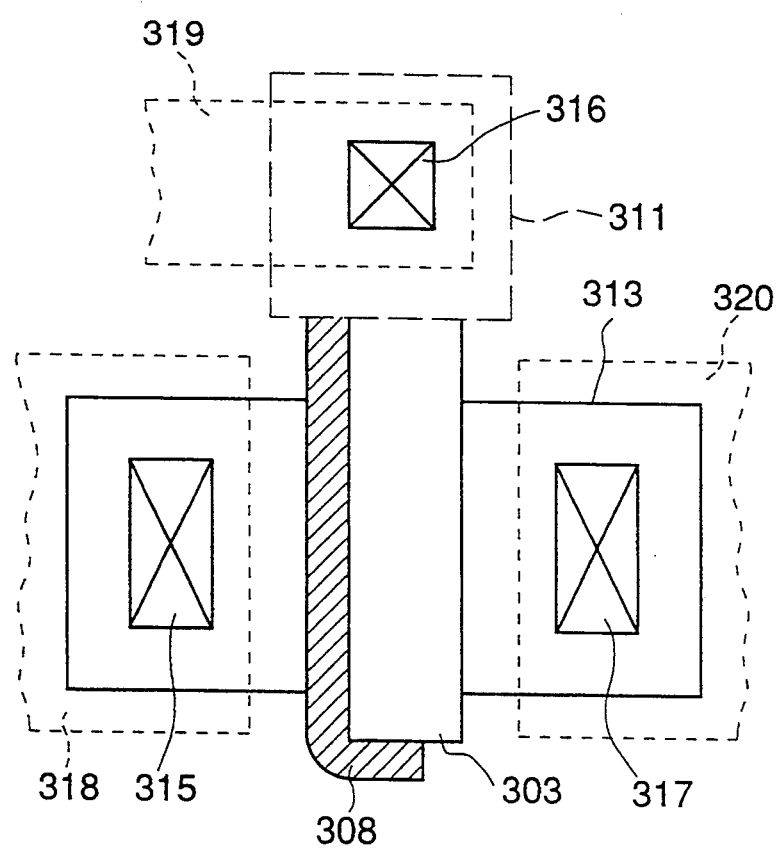
FIG. 42 is a plan view showing the fabrication process of the embodiment in accordance with the fabrication method of the semiconductor device of the present invention.

A structure with the cross section and plan as shown, in FIGS. 41 and 42 was formed through the same process as example 7.

In the figure, 309, 306 and 310 are emitter, base and collector regions, respectively, and a control electrode 308 directly above a base region 306 is composed of polycrystalline silicon on the side wall, with a width of about 260 nm. Accordingly, the base width in this example was about 260 nm. 313 is a selective oxide portion edge and 321 is an NSG interlayer insulating film.

311 is an Al wiring at the first layer which connects the control electrode to base lead-out electrode. 315, 316 and 317 are contact holes for leading out electrodes of emitter, base and collector, respectively. 318, 319 and 320 are Al wiring on the second layer.

In the example 7, an oxide film near the control electrode located on the boundary section between the first insulating film region and the second insulating film region is an intermittent film, producing many defects, which may cause a slight problem concerning the lead current or withstand voltage in the insulating film. However, the insulating film interface near the control electrode is a continuous film composed of excellent thermal oxide film by virtue of the film structure as shown in FIGS. 38 and 39, whereby the leak current or withstand voltage of insulating film could be improved.

EXAMPLE 9

This example will be described below using FIGS. 43 to 47.

Figure 43:
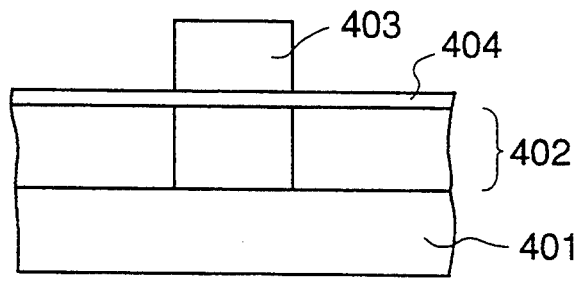
FIG. 43 is a cross-sectional view showing the fabrication process of the embodiment in accordance with the fabrication method of the semiconductor device of the present invention.

Complete dielectric separation between elements was performed by a separation method of selective oxidation for an SIMOX substrate in which the film thickness of a silicon oxide film for backing 401 was 400 nm and the film thickness of a silicon layer 402 was 200 nm, with the substrate density of 2E15 cm$^{-3}$. Then, a thermal oxide film 404 having a film thickness of 10 nm was formed on this substrate, and a silicon nitride film 403 was deposited 600 nm thick thereon and partially removed to form a structure as shown in FIG. 43. Like the seventh and eighth examples, a P-type region 406 corresponding to the base impurity density was formed by ion implantation of boron.

Figure 44:
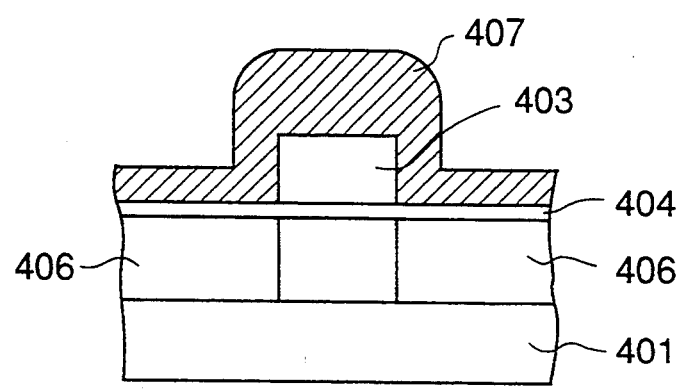
FIG. 44 is a cross-sectional view showing the fabrication process of the embodiment in accordance with the fabrication method of the semiconductor device of the present invention.
Figure 45:
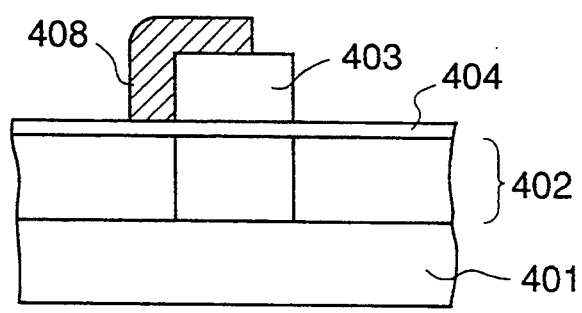
FIG. 45 is a cross-sectional view showing the fabrication process of the embodiment in accordance with the fabrication method of the semiconductor device of the present invention.

Then, polycrystalline silicon was deposited by CVD, but polycrystalline silicon was deposited more likely on the silicon nitride film 403 than on the silicon oxide film 404 by adjusting the partial pressure of etching gas or HCl. consequently, polycrystalline silicon on the silicon nitride film was thicker than on the silicon oxide film, as shown in FIG. 44. A side wall was formed by anisotropic etching, and the side wall on the side of selector lead-out electrode region was removed in a similar way to that of the first and second examples. As a result, a structure as shown in FIG. 45 was formed. Because polycrystalline silicon on the silicon nitride film is thicker than that on the silicon oxide film, polycrystalline silicon is left behind on the silicon nitride film.

Figure 46:
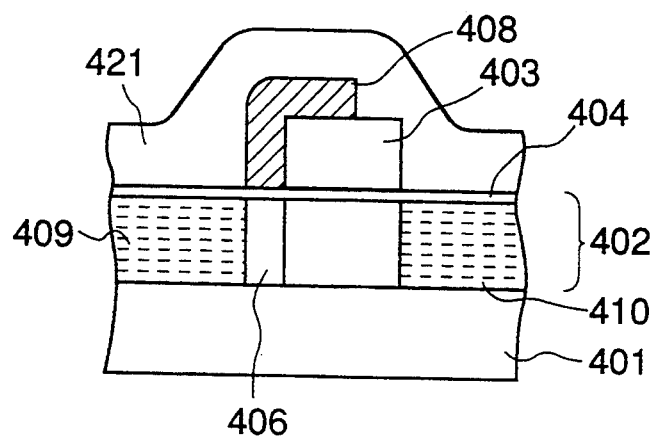
FIG. 46 is a cross-sectional view showing the fabrication process of the embodiment in accordance with the fabrication method of the semiconductor device of the present invention.
Figure 47:
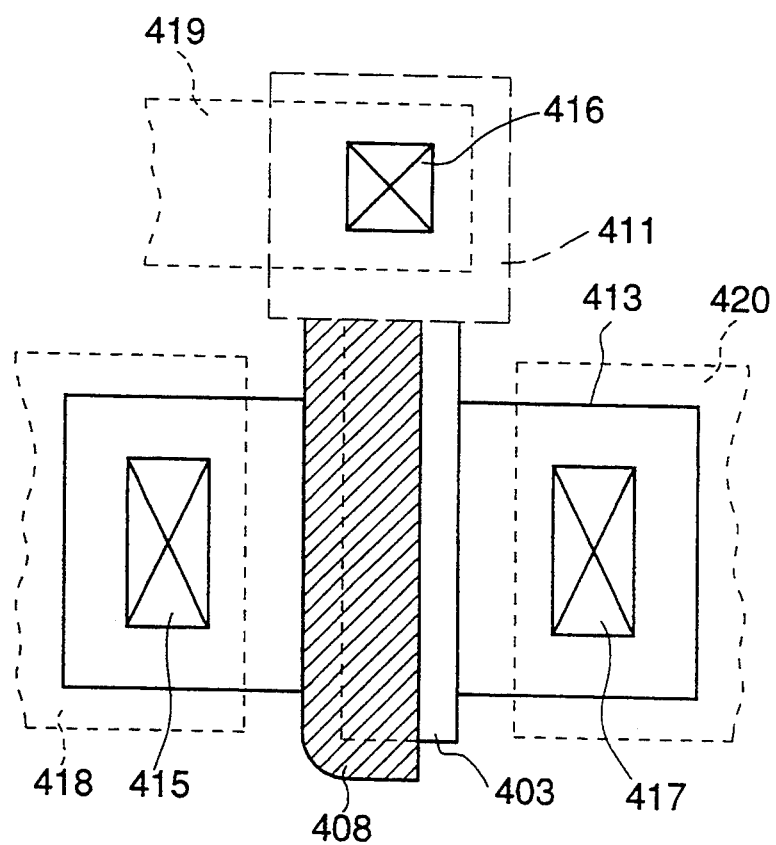
FIG. 47 is a plan view showing the fabrication process of the embodiment in accordance with the fabrication method of the semiconductor device of the present invention.

A structure with the cross section and plan as shown in FIGS. 46 and 47 was formed through the same process as the seventh and eight examples.

In the figure, 409,m 406 and 410 are emitter, base and collector regions, respectively, and a control electrode 408 directly above a base region 406 is composed of polycrystalline silicon on the side wall, with its width of about 260 nm. Accordingly, the base width in this example was about 260 nm. 413 is a selective oxide portion edge and 421 is an NSG interlayer insulating film.

411 is an Al wiring on the first layer which connects the control electrode to the base lead-out electrode. 415, 416 and 417 are contact holes for leading out electrodes of emitter, base and collector, respectively. 418, 419 and 420 are Al wiring on the second layer.

In the seventh and eighth examples, the control electrode is highly resistive, but in this example, the silicon nitride film is used for the second insulating film region 403, and further the deposition conditions of polycrystalline silicon for conductive film are optimized to also leave conductive film on the silicon nitride film 403. Consequently, its resistance could be made smaller than that of the control electrode.

EXAMPLE 10

In this example, tungsten silicide was used for the control electrode to make the resistance lower than in the ninth example. This example will be described below.

A structure of FIG. 45 was formed through the same process as the ninth example. thereafter, tungsten was deposited, and heat treatment was conducted in He gas atmosphere at 1000° C. for twenty minutes. As a result, a side wall 408 of FIG. 45 became $WSi_2$. The same process as the ninth example was employed, except for the annealing conditions for the activation of impurities of emitter/collector. The heat treatment for the activation of impurities of emitter/collector was conducted under the conditions of 900° C./30 minutes in He gas atmosphere.

With this example, the control electrode having a resistance smaller roughly by one figure than the ninth example could be formed, and the AC characteristic improved.

EXAMPLE 11

This example is one in which an NPN-type bipolar transistor with control electrode and a CMOS circuit were fabricated simultaneously. This example will be described below, using FIGS. 48 to 54.

Complete dielectric separation between elements was performed by a separating method of selective oxidation for an SIMOX substrate in which the film thickness of a silicon oxide film for backing 501 was 400 nm and the film thickness of a silicon layer 502 was 200 nm, with the substrate density of $2E15$ cm$^{-3}$. Then, using a resist mask having opened only the region for N-type MOS transistor of CMOS circuit to be made after forming the mask having a thickness of 10 nm by oxidation, ion implantation of boron was conducted with a dose quantity of $8E11$ cm$^{-2}$, and an implantation energy of 20 KeV to form a P-type region having a substrate density of $3E16$ cm$^{-3}$. Similarly, using a resist mask having opened only the region for P-type MOS transistor of CMOS circuit to be made, ion implantation of phosphorus was conducted with a dose quantity of $4E11$ cm$^{-2}$ and an implantation energy of 60 KeV to form an N-type region of $1E16$ cm$^{-3}$.

Figure 48:
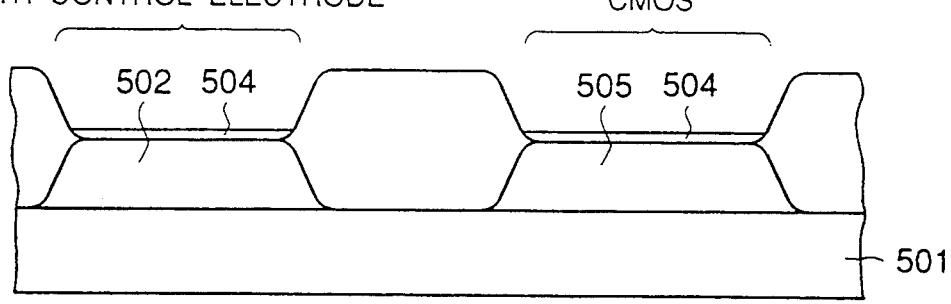
FIG. 48 is a cross-sectional view showing the fabrication process of the embodiment in accordance with the fabrication method of the semiconductor device of the present invention.
Figure 49:
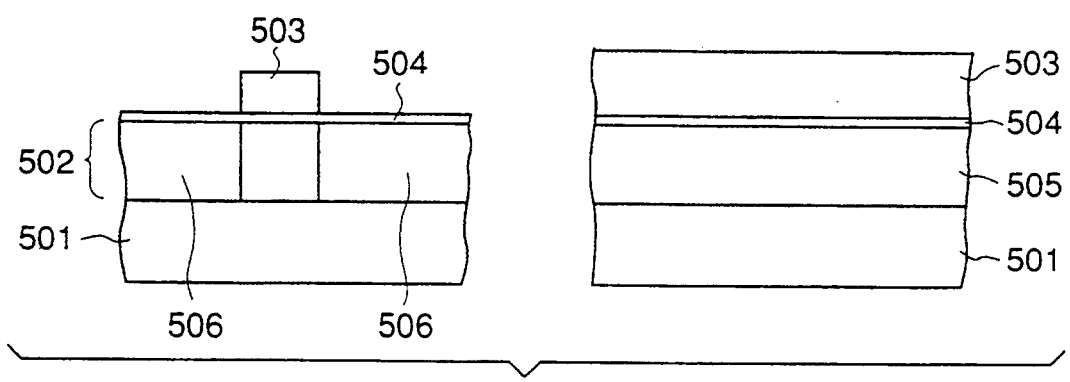
FIG. 49 is a cross-sectional view showing the fabrication process of the embodiment in accordance with the fabrication method of the semiconductor device of the present invention.

Then, a thermal oxide film 504 having a film thickness of 10 nm was formed on this substrate. FIG. 48 shows a cross-sectional structure after the formation of thermal oxide film. This figure shows, on the left hand, a lateral bipolar transistor with control electrode, and on the right hand, a CMOS portion (a typical view useful for both the N-type MOS transistor and the P-type MOS transistor). And a silicon nitride film 503 was deposited 600 nm thick thereon, and the silicon nitride film 503 in the lateral bipolar transistor region with control electrode was partially removed to form a structure as shown in FIG. 49. Like the seventh and eight examples, a P-type region 506 corresponding to the base impurity density was formed by ion implantation of boron. Implantation of boron ions was not performed into the CMOS region which was masked with the silicon nitride film 503.

Figure 50:
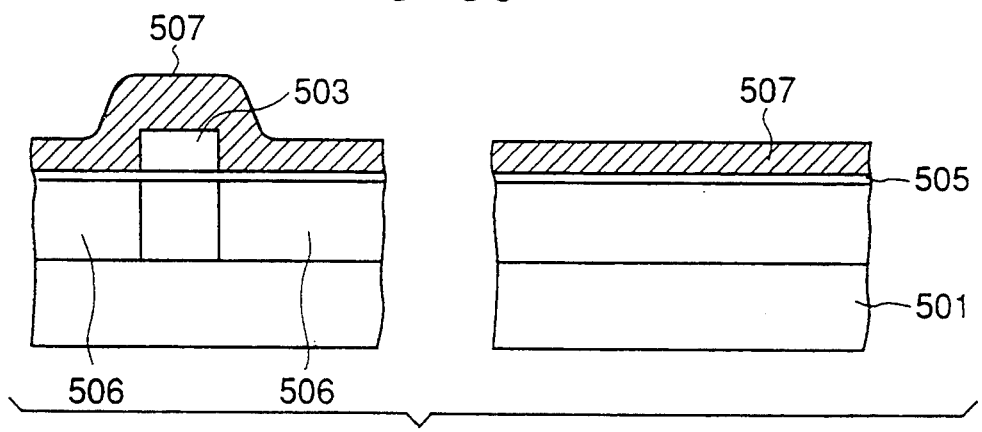
FIG. 50 is a cross-sectional view showing the fabrication process of the embodiment in accordance with the fabrication method of the semiconductor device of the present invention.

The silicon nitride film 503 in the CMOS region was removed with only the bipolar transistor region with control electrode masked with a resist mask, and polycrystalline silicon was deposited by CVD, as in the ninth example. That is, polycrystalline silicon was deposited more likely on the silicon nitride film 503 than on the silicon oxide film 504 by adjusting the partial pressure of etching gas or HCl. Consequently, polycrystalline silicon on the silicon nitride film was thicker than on the silicon oxide film, as shown in FIG. 50.

Ion implantation of phosphorus was performed to this polycrystalline silicon, as in the seventh, eighth and ninth embodiments, to enhance the conductivity of polycrystalline silicon.

Figure 51:
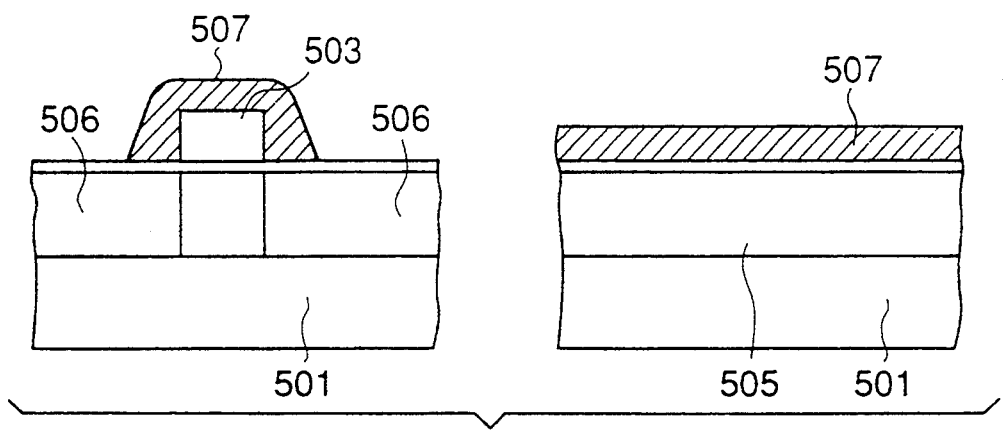
FIG. 51 is a cross-sectional view showing the fabrication process of the embodiment in accordance with the fabrication method of the semiconductor device of the present invention.
Figure 52:
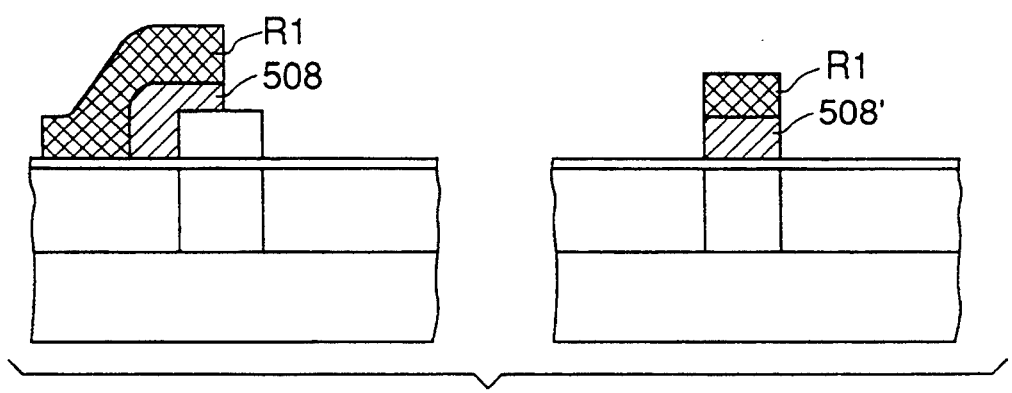
FIG. 52 is a cross-sectional view showing the fabrication process of the embodiment in accordance with the fabrication method of the semiconductor device of the present invention.
Figure 53:
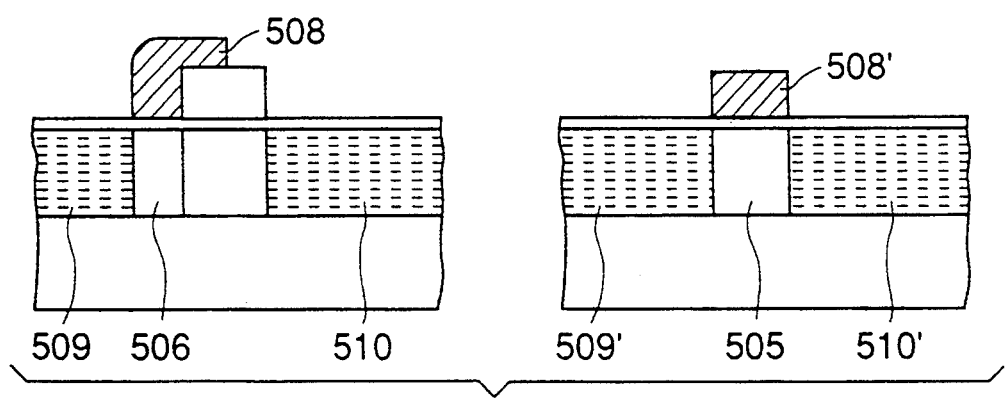
FIG. 53 is a cross-sectional view showing the fabrication process of the embodiment in accordance with the fabrication method of the semiconductor device of the present invention.

Then, a side wall was formed by anisotropic etching in the lateral bipolar transistor region with control electrode, with the CMOS region covered by a resist mask. Polycrystalline silicon in the CMOS region which was covered by the resist mask was left intact (FIG. 51). Then, the side wall on the collector side of the lateral bipolar transistor with control electrode was removed with resist R1 as a mask, as shown in FIG. 52, and gate electrode 508' of CMOS was formed. Then, using a resist mask having opened the emitter/collector portion in the lateral bipolar transistor region with control electrode, the source/drain portion of N-type MOS transistor in the CMOS region, and the channel electrode portion of P-type MOS transistor, ion implantation of N-type impurities was conducted. The ion implantation conditions were such that the ion species was As, the implantation energy was 150 KeV, and the dose quantity was $5E15$ cm$^{-2}$. As a result, an emitter region 509, a collector lead-out electrode region 510, a source region 509' of the N-type MOS transistor, a drain region 519', and a channel electrode of the P-type MOS transistor were formed. A resist film was newly formed having opened a base electrode portion of the lateral bipolar transistor with control electrode, a channel electrode portion of N-type MOS transistor in the CMOS region, and a source/drain portion of p-type MOS transistor after peeling off the resist, and ion implantation of boron was conducted with an implantation energy of 20 KeV and a dose quantity of $1E15$ cm$^{-2}$. Consequently, a high density impurity region for each electrode was formed. After peeling off the resist, heat treatment was conducted in a nitrogen atmosphere at 1000° C. for ten minutes to activate impurities. As a result, a structure as shown in FIG. 53 was formed.

Figure 54:
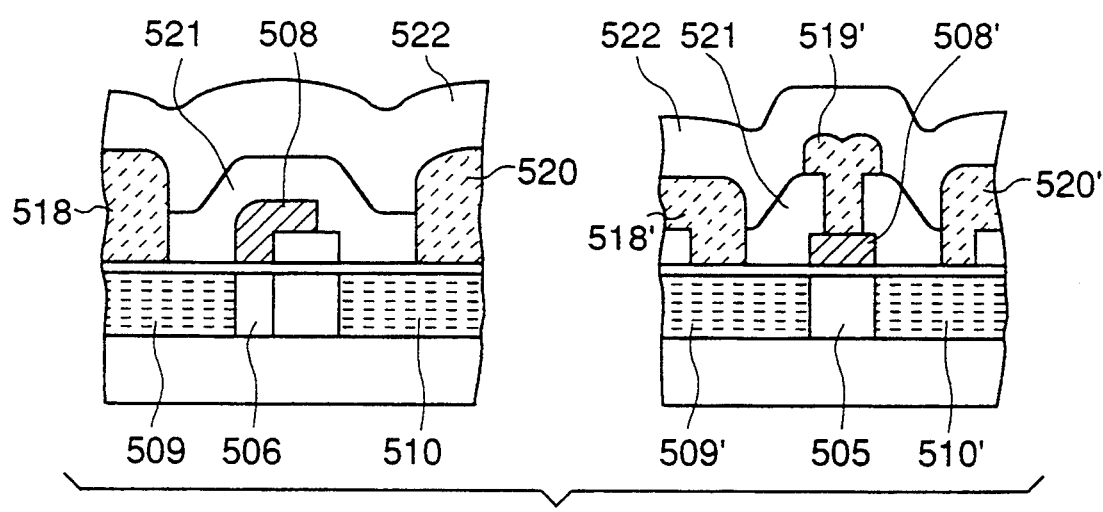
FIG. 54 is a cross-sectional view showing the fabrication process of the embodiment in accordance with the fabrication method of the semiconductor device of the present invention.

As shown in FIG. 54, the control electrode and the base electrode were electrically coupled as in the ninth example. PSG film was deposited 500 nm thick as an interlayer insulating film 521. Then, contact holes were formed to lead out the emitter 509 and the base/collector electrode 510 for the lateral bipolar transistor with control electrode, and the source 509', drain 510' and channel electrode for the N-type MOS transistor and P-type MOS transistor. Al was deposited as the second layer, each electrode (518, 520, 518', 520', 519') was taken out and the wiring applied. PSG film was deposited 500 nm thick as a passivation film 522 and a contact hole for the pad was opened.

EXAMPLE 12

Figure 55:
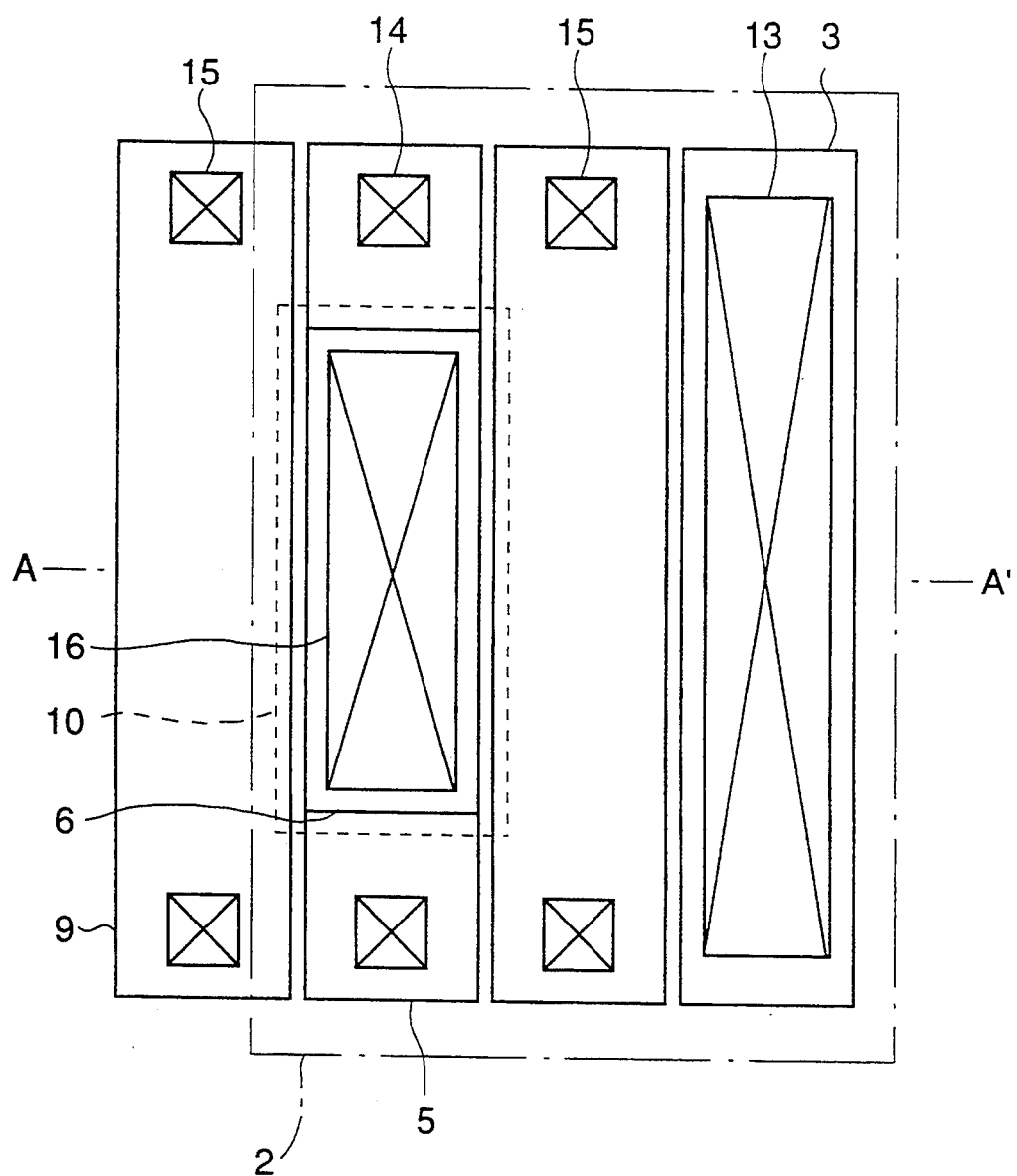
FIG. 55 is a plan view showing an embodiment of a bipolar transistor of the present invention.
Figure 56:
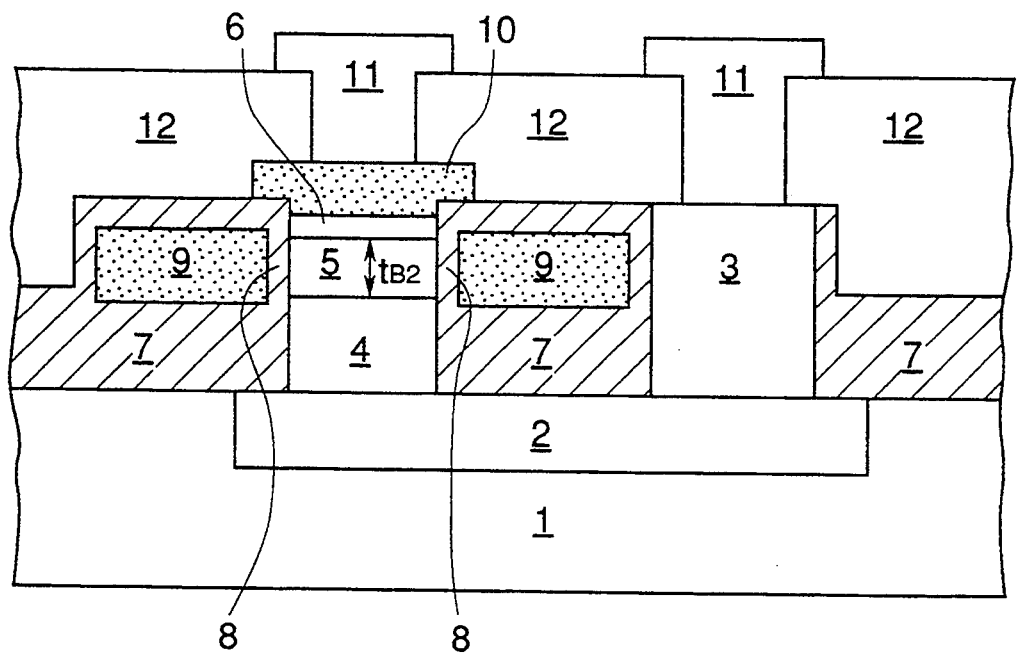
FIG. 56 is a cross-sectional view taken along the line A—A in FIG. 55.

FIG. 55 is a plan view showing a twelfth example of a bipolar transistor according to the present invention. And FIG. 56 is a cross-sectional view taken along the line AA of FIG. 55. In both figures, 1 is a P-type substrate, 2 is an N-type buried region for the reduction of collector resistance, and 3 is an N-type region formed for the lead-out of collector electrode. 4 is an N$^-$ region acting as the collector, 5 is a P-type base region, and 6 is an N-type emitter region. 7 and 8 are oxide films, and 9 is a control electrode for controlling the state of the side face of base region 5 in contact with the oxide film 8. 10 is an N-type polycrystalline silicon electrode for the lead-out of emitter electrode, 11 is an AL electrode, and 12 is an interlayer insulating film such as PSG. Note that the AL electrode 11 and the interlayer insulating film 12 are not shown in FIG. 55 for simplification. 13 is a contact hole of the collector region, 14 is a contact hole of the base region, 15 is a contact hole of the control electrode, and 16 is a contact hole of the emitter region.

Figure 71:
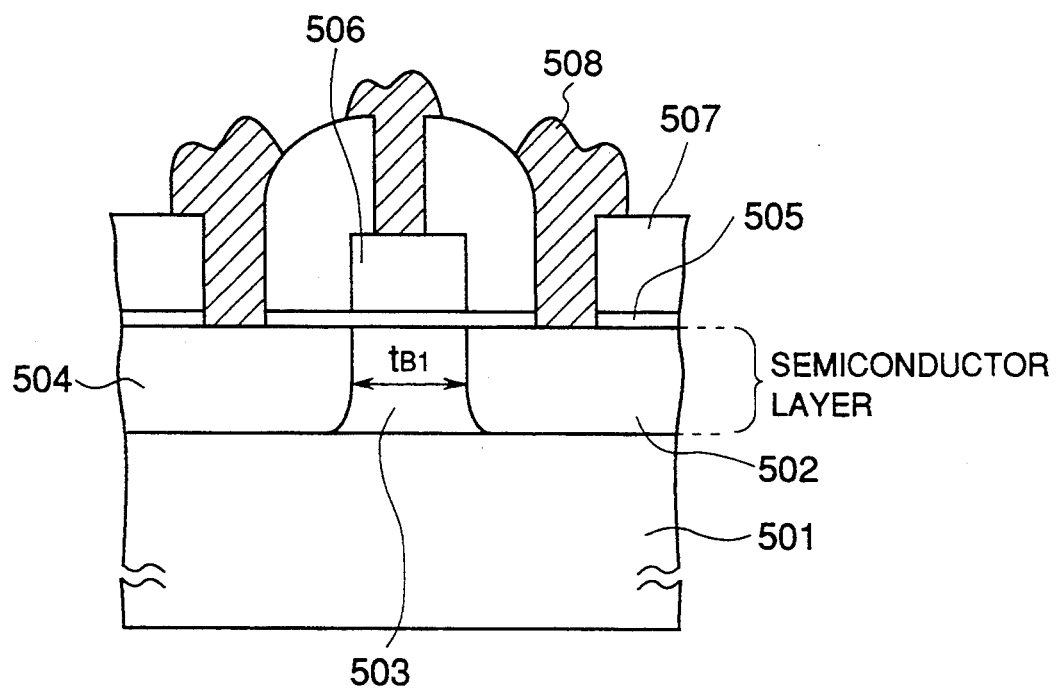
FIG. 71 is a cross-sectional view of a lateral bipolar transistor with control electrode.

As shown in FIG. 56, the bipolar transistor of this example is vertical bipolar transistor of this example is a vertical bipolar transistor comprised of an N$^-$ region 4 (collector region), a P-type region 5 (base region), and an N-type region 6 (emitter region), the control electrode 9 being formed via the oxide film on the side of base region 5. The base region 5 is formed by introducing impurities from the substrate surface, whereby the base width ($t_{B2}$) can be smaller than the base width ($t_{B1}$) in the conventional constitution as shown in FIG. 71.

A fabricating method of this example will be now described using FIGS. 57 to 62. First, N-type impurities were introduced by ion implantation to a desired site of P-type substrate 1, and heat treatment was conducted to form an N-type buried region 2, as shown in FIG. 57. Subsequently, an N$^-$ region 4 was formed by epitaxial growth.

After a thermal oxide film 18 having a thickness of 200 Å was formed on the surface of N$^-$ region 4, N-type impurities were introduced by ion implantation and heat treatment was conducted to form the N$^+$ region 3.

Subsequently, a 1500 Å-thick $Si_3N_4$ film 19 and a 2000 Å-thick $SiO_2$ film 20 were deposited respectively.

Anisotropic etching was conducted for other than a portion where the base, emitter, collector and collector lead-out electrodes were formed, so that a part of the N$^-$ region was left behind.

Then, thermal oxidation was conducted for the substrate surface to form a thermal oxide film 21, as shown in FIG. 4, and subsequently, $Si_3N_4$ was deposited over an entire surface. thereafter, anisotropic etching was conducted to leave $Si_3N_4$ film 22 only on the side of the silicon convex portion.

Figure 59:
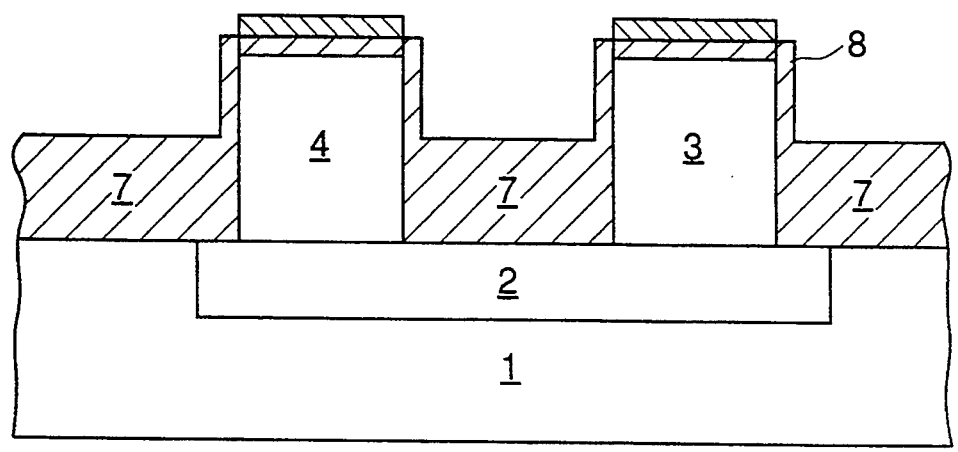
FIG. 59 is a cross-sectional view for explaining the fabrication method of the bipolar transistor as shown in FIGS. 55 and 56.

Also, thermal oxidation was conducted to form a thick oxide film 7, as shown in FIG. 59. The N$^+$ region 3 was spread over the entire convex portion due to heat treatment.

After $Si_3N_4$ film 22 and an oxide film 21 on the side of substrate convex portion were removed by wet etching, oxidation was conducted again to form an oxide film 8 having a thickness of about 50 to 100 Å.

Figure 60:
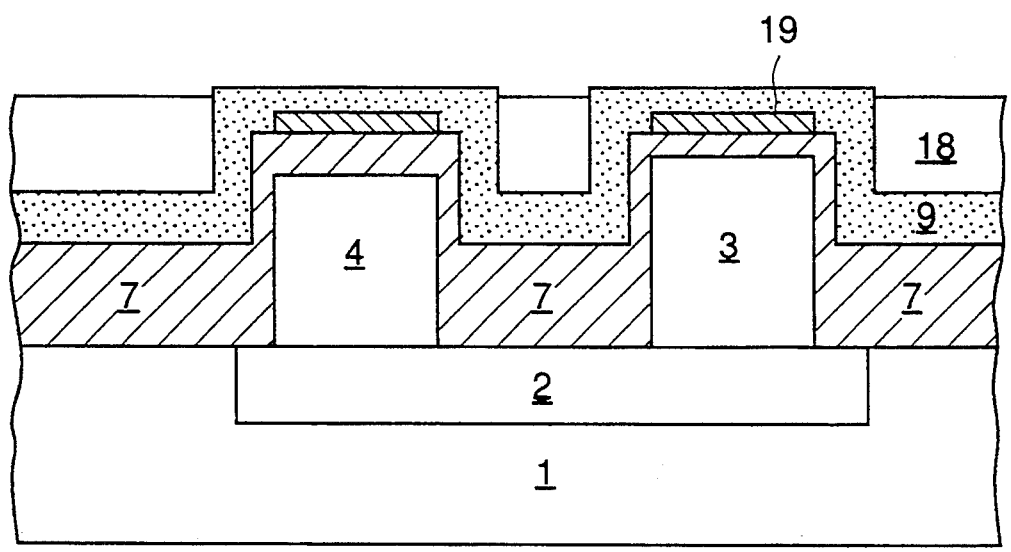
FIG. 60 is a cross-sectional view for explaining the fabrication method of the bipolar transistor as shown in FIGS. 55 and 56.

Then, polycrystalline silicon 9 was deposited over the entire surface, as shown in FIG. 60, and subsequently, N-type impurities such as As$^+$, P$_+$ were implanted and heat treatment was conducted. After a photo-resist 18 was applied flat, the photo-resist was removed until polysilicon of a convex portion appeared by oxygen plasma etching.

Figure 61:
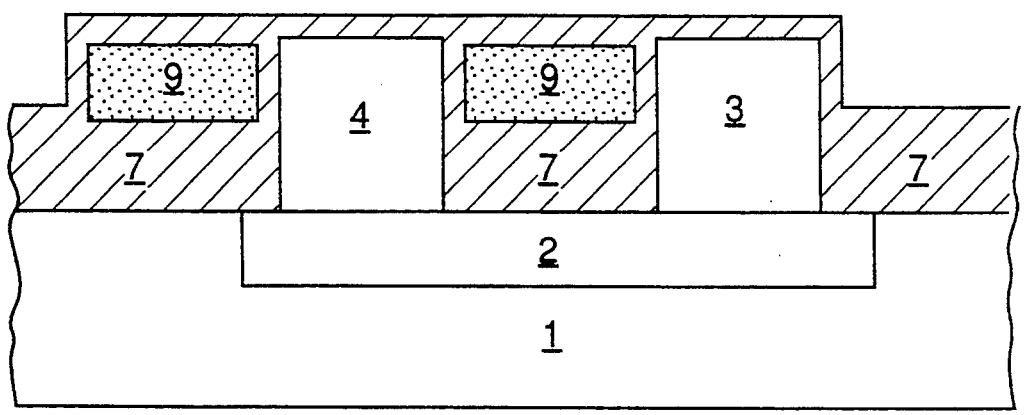
FIG. 61 is a cross-sectional view for explaining the fabrication method of the bipolar transistor as shown in FIGS. 55 and 56.

Then, a desired portion of polycrystalline silicon was removed by dry etching using a mixture gas of $CF_4$ and $H_2$, as shown in FIG. 61. Subsequently, $Si_3N_4$ film 19 was removed. Polycrystalline silicon was oxidized by thermal oxidation to obtain a structure as shown in FIG. 61.

Figure 62:
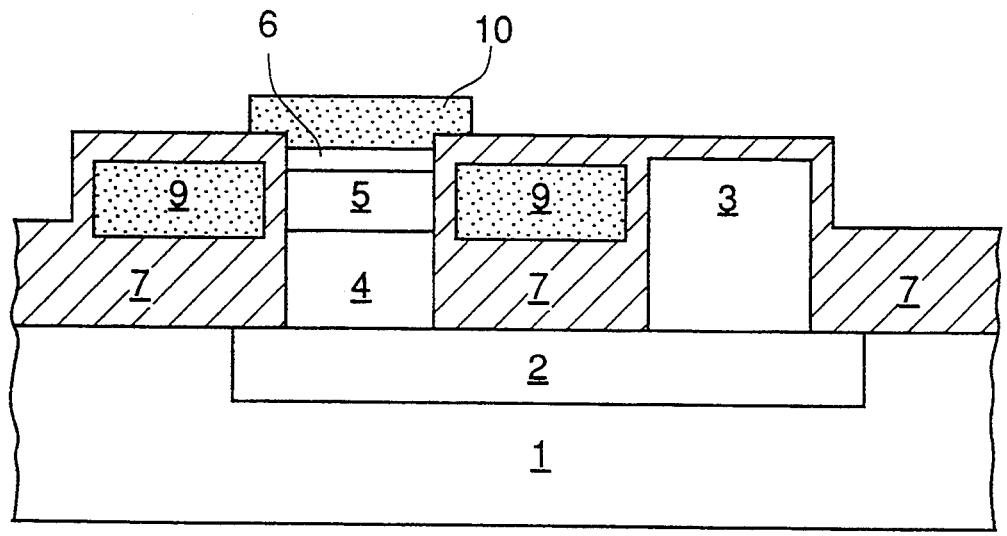
FIG. 62 is a cross-sectional view for explaining the fabrication method of the bipolar transistor as shown in FIGS. 55 and 56.

Then, P-type impurities such as B$^+$ were introduced by ion implantation and heat treatment was conducted to form a base region 5, as shown in FIG. 62.

Then, a contract hole for leading out the emitter electrode was formed at a desired site on the oxide film and subsequently, a polycrystalline silicon was deposited. Then, N-type impurities such as As$^+$, P$^+$ were introduced by ion implantation and heat treatment was conducted. Thereafter, an unnecessary portion was removed by etching to form an emitter region 6 and emitter lead-out electrode 10.

After an interlayer insulating film 12 such as PSG or BPSG was deposited by CVD, the interlayer was etched in a desired portion to form a contact hole.

Subsequently, a metal such as AL was deposited by sputtering, and thereafter etched to form an electrode 11, whereby a vertical bipolar transistor with control electrode was fabricated as shown in FIGS. 55 and 56.

The vertical bipolar transistor with control electrode fabricated in the above process and an on-state current of 0.4V and a base width of 0.2 μm, resulting in excellent characteristics with high speed.

EXAMPLE 13

Figure 63:
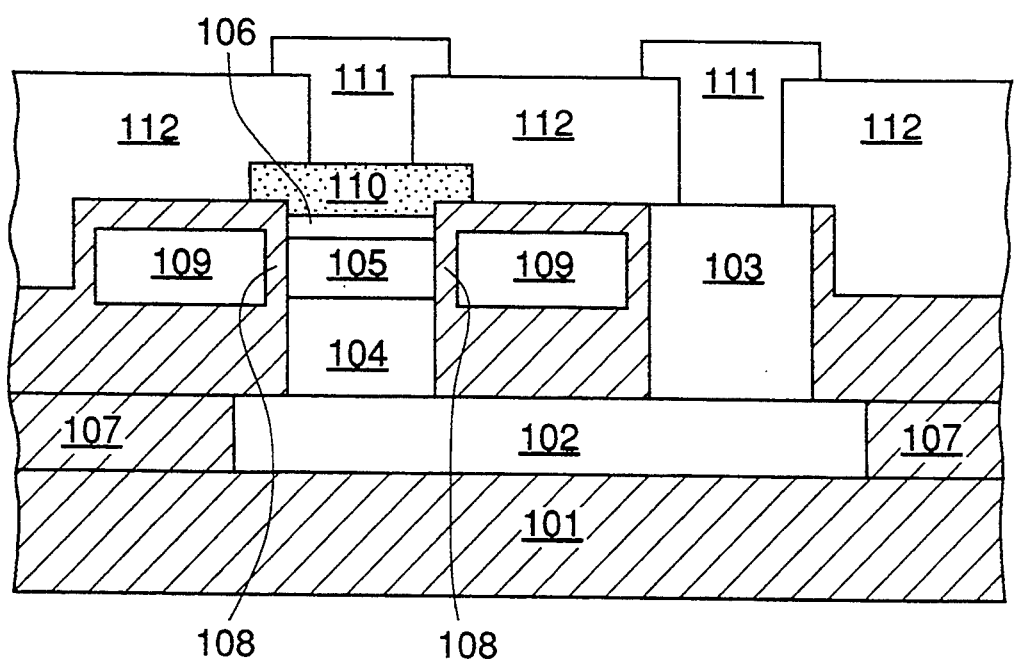
FIG. 63 is a cross-sectional view showing another embodiment of a bipolar transistor of the present invention.

FIG. 63 is a cross-sectional view show8ing a thirteenth example of a bipolar transistor according to the present invention. In this example. the present invention is applied to a SOI substrate.

In FIG. 63, 101 is an oxide film, 102 is an N-type buried region, and 103 is an N-type region formed for the lead-out of collector electrode. 104 is an N region acting as the collector, 105 is a P-type base region, and 106 is an N-type emitter region. 107 and 108 are oxide films, and 109 is a control electrode for controlling the state of the side face of base region 105 in contact with the oxide film 108.

110 is an N-type polycrystalline silicon electrode for the lead-out of emitter electrode, 111 is an AL electrode, and 112 is an interlayer insulating film such as PSG.

The structure of this example can be fabricated by a fabrication method as shown in example 12.

First, the N-type buried region 102 was formed at a desired site on the SOI substrate, and epitaxial growth was conducted. In the same way as the example 1 hereinafter, after forming a convex portion of a silicon region, an oxide film 107 for element separation was formed by oxidation until all the silicon layer of the SOI substrate became an oxide film on field oxidation. After that, the bipolar transistor was fabricated in the same way as shown in the example 12.

In this way, the present invention can be also applied to the SOI substrate, whereby a Bi-CMOS circuit with low consumption power and high speed can e formed in combination with a MOS transistor having a small parasitic capacity formed on SOI with high speed.

EXAMPLE 14

Figure 64:
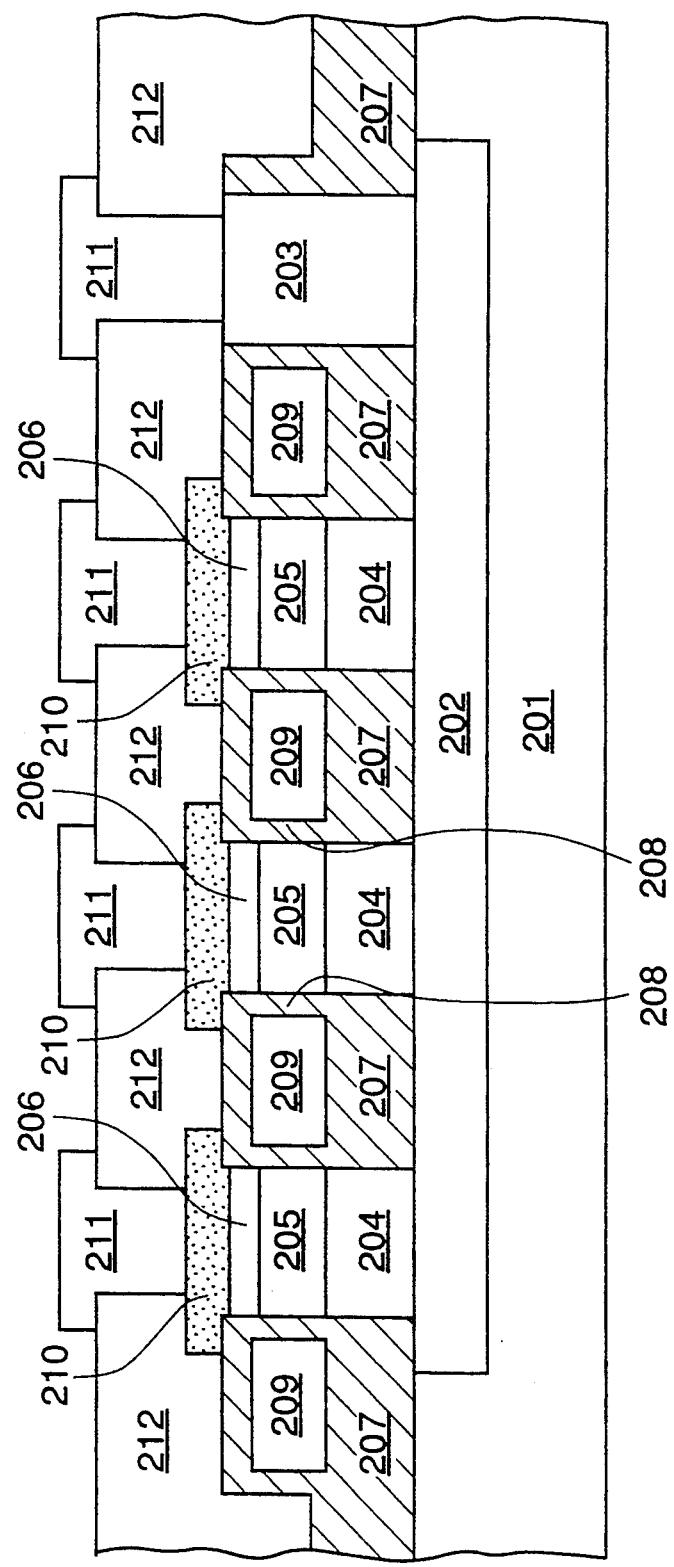
FIG. 64 is a cross-sectional view showing another embodiment of a bipolar transistor of the present invention.

FIG. 64 is a cross-sectional view showing a fourteenth example of a bipolar transistor according to the present invention.

This example shows a case where the present invention is applied to the bipolar transistor of multi-emitter. In FIG. 64, three emitters are shown.

With the conventional lateral bipolar transistor with control electrode, a multi-emitter structure is difficult to fabricate, but with the vertical bipolar transistor with control electrode, the bipolar transistor of multi-emitter is easily fabricated, and can have the large current to flow.

In FIG. 64, 201 is a P-type substrate, 202 is an N-type buried region for the reduction of collector resistance, and 203 is an N-type emitter region formed for the lead-out of collector electrode. 204 is an N region acting as the collector, 205 is a P-type base region, and 206 is an N-type emitter region. 207 and 208 are oxide films, and 209 is a control electrode for controlling the state of the side face of base region 205 in contact with the oxide film 208. 210 is an N-type polycrystalline silicon electrode for the lead-out of emitter electrode, 211 is an AL electrode, and 212 is an interlayer insulating film such as PSG.

EXAMPLE 15

Figure 65:
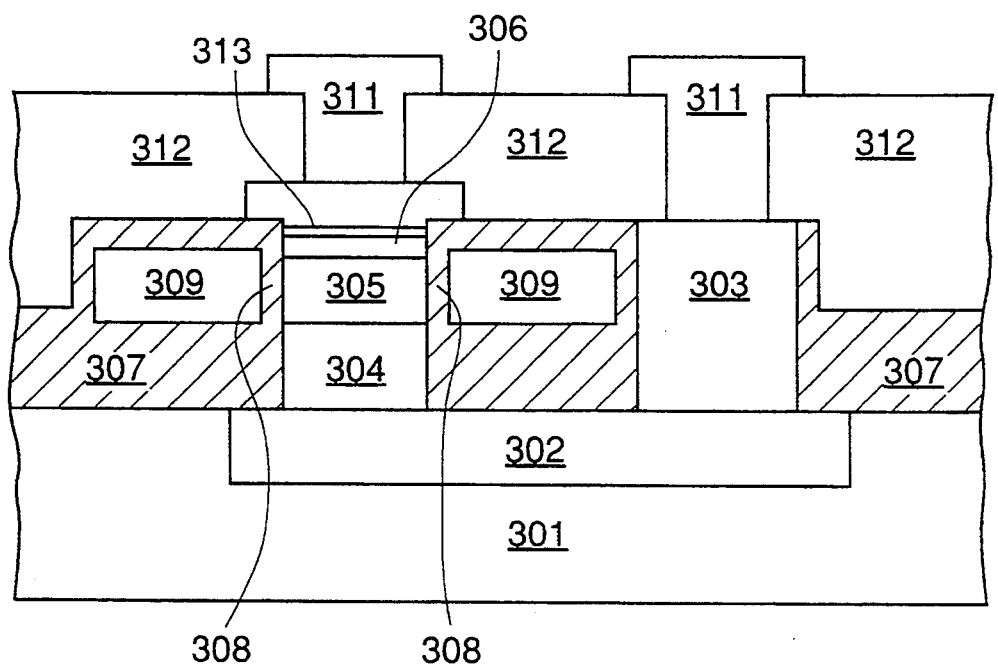
FIG. 65 is a cross-sectional view showing another embodiment of a bipolar transistor of the present invention.

FIG. 65 is a cross-sectional view showing a fifteenth example of a bipolar transistor according to the present invention. This example shows a case where the present invention is applied to a device with a thin interfacial oxide film capable of readily flowing tunnel current which is formed between emitter region and emitter electrode.

In FIG. 65, 313 is an interfacial oxide film having a thickness of about 10 Å capable of flowing tunnel current. Other portions of the same constitution as the example 12.

The interfacial oxide film 313 suppresses the inflow of minority carriers (base current: $I_B$) flowing from the base region into the emitter region, while maintaining the flow of majority carriers (emitter current: $I_E$) from the emitter electrode to the emitter region. Therefore, a bipolar transistor having a large current amplification factor ($I_E/I_B - 1$) can be obtained.

Hence, in this example, the bipolar transistor which is capable of being driven at low voltages and has high speed and high current amplification factor can be obtained.

EXAMPLE 16

Figure 66:
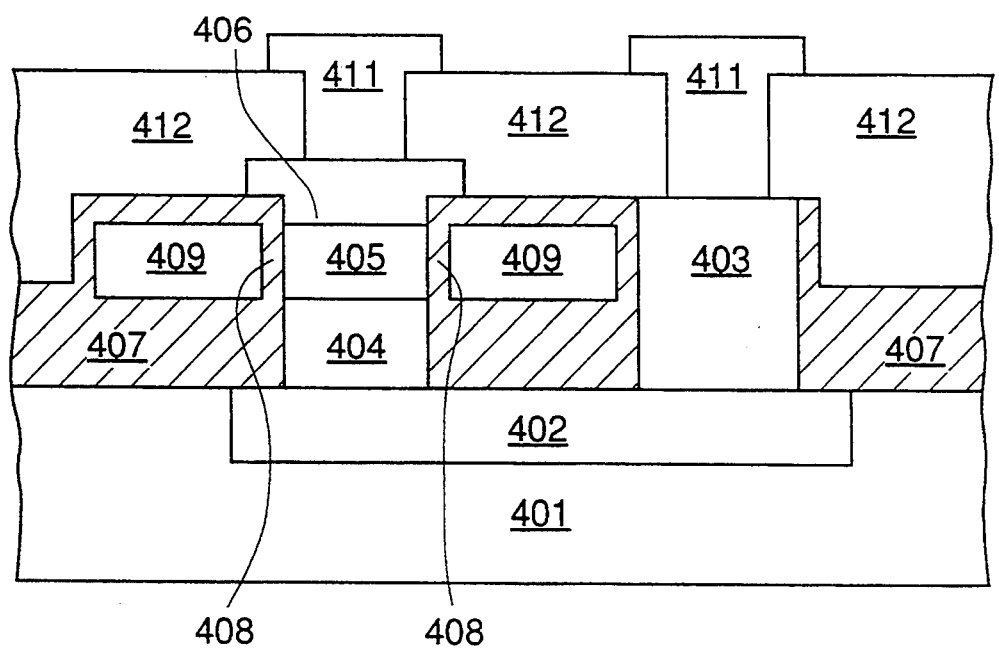
FIG. 66 is a cross-sectional view showing another embodiment of a bipolar transistor of the present invention.
Figure 67:
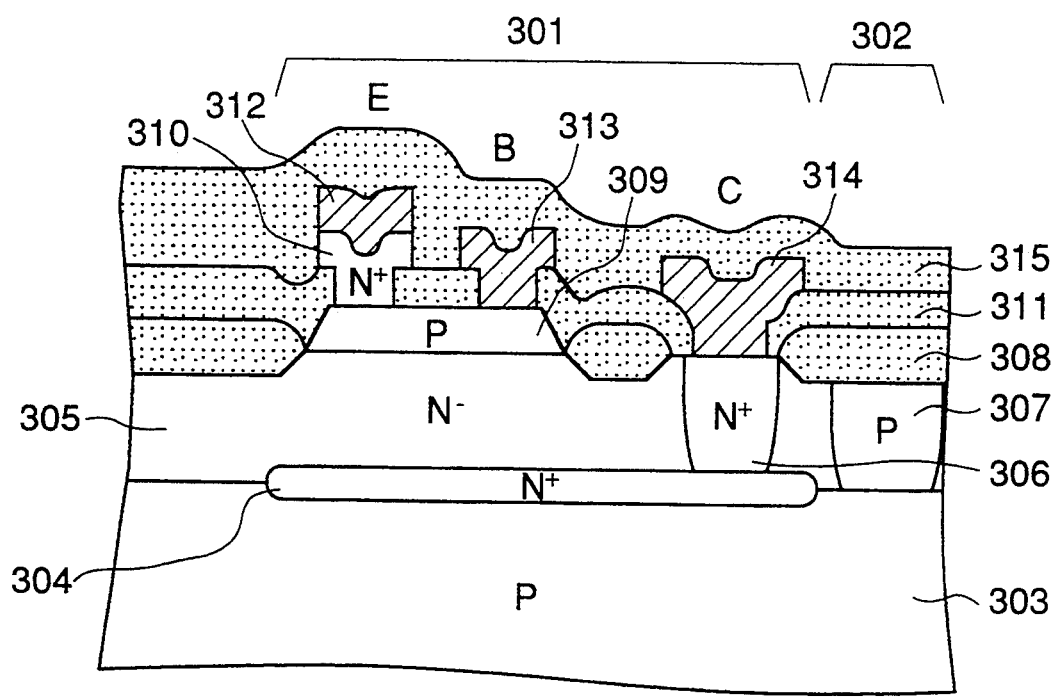
FIG. 67 is an explanation view of a conventional example.
Figure 68:
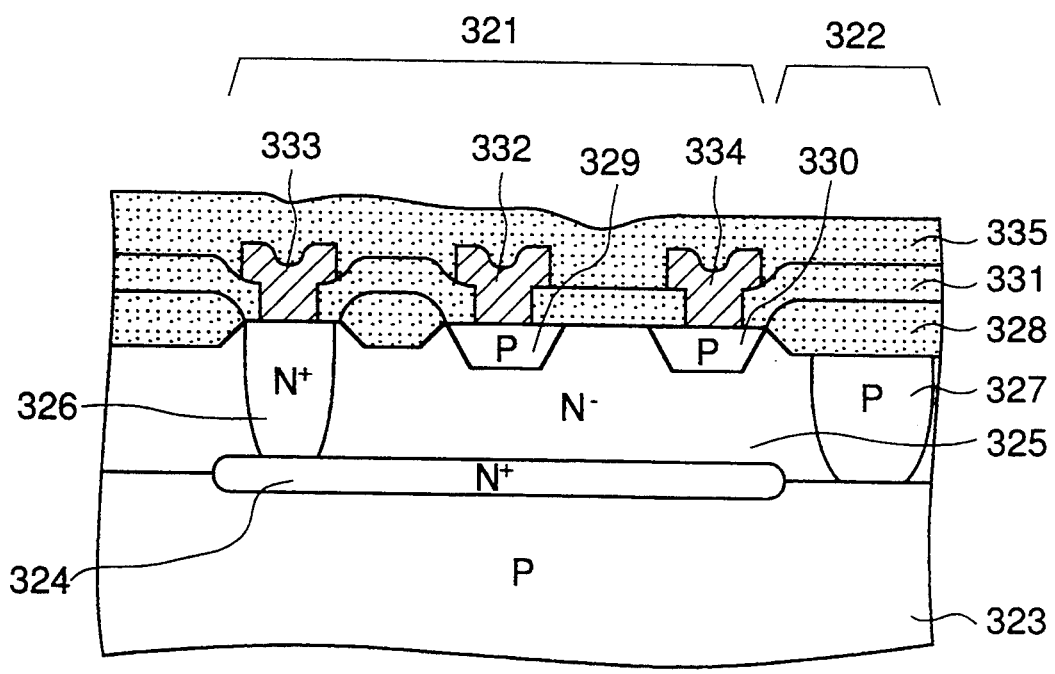
FIG. 68 is an explanation view of a conventional example.
Figure 69A:
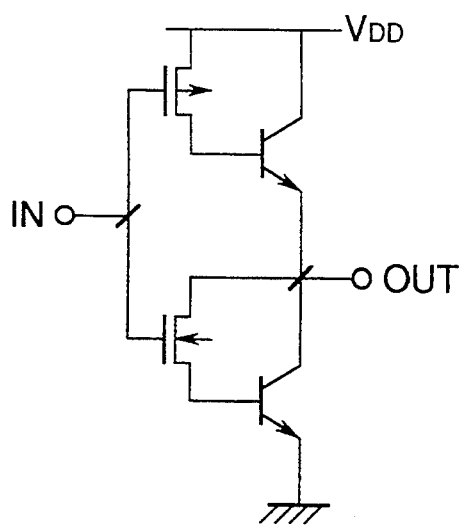
FIGS. 69A and 69B are explanation diagrams of one example of a Bi-CMOS circuit.
Figure 69B:
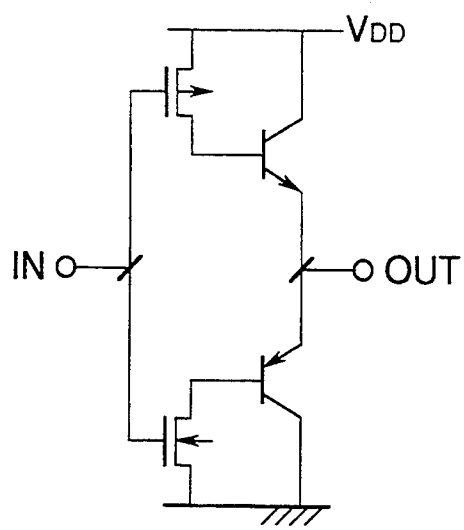
Figure 70:
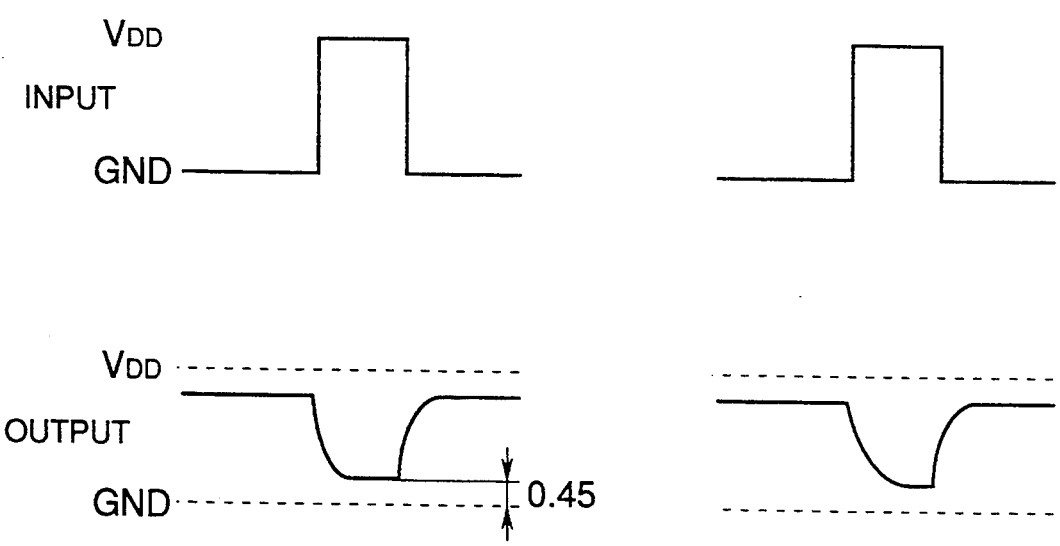
FIG. 70 is a explanation diagram of input/output results of the Bi-CMOS circuit.

FIG. 66 is a cross-sectional view housing a sixteenth example of a bipolar transistor according to the present invention. This example shows a case where the present invention is applied to HBT (hetero bipolar transistor) in which the band gap of the emitter region is wider than the band gap of the base region.]

In FIG. 66, the emitter region 406 is composed of a material having a wider band gap than the base region, such as microcrystalline or amorphous semiconductor. This can be accomplished by ion implantation of Si into the emitter region. Other portions have the same constitution as the example 12.

Also, SiC can be used for the material with a large band gap. When $Si_{1-X}C_X$ is used for the emitter region, C in $Si_{1-X}C_X$ is formed by ion implantation of carbon ions C+ into crystalline silicon. The upper limit of carbon C is 0.5, but is desirable to satisfy the inequality X ≦ about 0.075 to reduce the stress of $Si_{1-X}C_X$. The lower limit of carbon C is determined by the stopping ability of holes, wherein carbon C is necessary in amount of $10^{20}$ cm$^{-3}$ or greater. In this way, forming $Si_{1-X}C_X$ by ion implantation, the quantity C is reduced near the base interface, but crystal defects are conversely decreased, whereby there is no problem with the characteristic of a bipolar transistor.

What is claimed is:

1. A semiconductor device comprising:
   a first semiconductor region of a first conductivity type formed on an insulating substrate;
   an insulating layer formed in contact with said first semiconductor region at a side opposite to said insulating substrate;
   a control electrode arranged on said first semiconductor region sandwiching said insulating layer therebetween;
   second and third semiconductor regions adjacent to and sandwiching said first semiconductor region; and
   first, second and third electrodes connected respectively to said first, second and third semiconductor regions;
   wherein potentials of said second and third electrodes and said control electrode are regulated for converting the current flowing from said second semiconductor region through said first semiconductor region into said third semiconductor region, characterized in that
   a thickness of said insulating layer, a material of said control electrode, an impurity concentration of said first semiconductor region and a thickness of said first semiconductor region are determined so that, under a condition that said first, second and third electrodes and said control electrode are maintained at the same potential, said first semiconductor region is depleted, and a surface of said first semiconductor region in contact with said insulating layer is at a weakly inverted state, and in that said control electrode and said third electrode connected to said first semiconductor region are at the same potential when a driving potential is applied thereto.

2. A semiconductor device according to claim 1, wherein in said first, second and third semiconductor regions reside on an insulating substrate, and said first, second and third semiconductor regions may be disposed to be in contact with one another in the order of said second, first and third semiconductor regions, and with said insulating substrate to have a Silicon on Insulator (SOI) structure.

3. A semiconductor device according to claim 1, wherein said control electrode material is determined from the work function of said control electrode material.

4. A semiconductor device according to any one of claims 1 to 3, wherein said first semiconductor region is a base region, and said second and third semiconductor regions are an emitter region and a collector region, respectively, to constitute a bipolar transistor.

5. A semiconductor device according to claim 4, wherein the distance from emitter junction of said base region to collector junction is equal to or less than 0.3 μm.

6. A semiconductor device according to claim 1, wherein a base region of said first semiconductor region is formed by diffusion of impurities from the substrate surface, and said control electrode is formed via an insulating film on the side of said base region to constitute a bipolar transistor.

7. A semiconductor device according to claim 6, wherein the impurity concentration profile in said base region is smaller from emitter junction to collector junction.

8. A semiconductor device according to claim 6 or 7, wherein two or more emitter regions serving as said second semiconductor region are formed.

9. A semiconductor device according to claim 6 or 7, wherein a thin oxide film is provided between the emitter region serving as said second semiconductor region and the emitter electrode, the conduction between said emitter region and said emitter electrode being through the use of tunnel current.

10. A semiconductor device according to claim 6 or 7 wherein the emitter region serving as said second semiconductor region is constituted from a semiconductor having a larger forbidden band width than the semiconductor constituting said base region.

11. A semiconductor device according to claim 10, wherein said semiconductor having larger forbidden band width is made of microcrystalline or amorphous semiconductor.

12. A semiconductor device according to claim 10, wherein said semiconductor having large forbidden band width is made of SiC.

* * * * *

UNITED STATES PATENT AND TRADEMARK OFFICE
CERTIFICATE OF CORRECTION

PATENT NO. : 5,451,798

DATED : September 19, 1995

INVENTOR(S): HISANORI TSUDA ET AL.

It is certified that error appears in the above-identified patent and that said Letters Patent is hereby corrected as shown below:

COLUMN 1

Line 31, "chose" should read --chosen--.

COLUMN 2

Line 20, "The fabrica-" should be deleted.
    Line 21, "tion of Bi-CMOS using the SOI substrate." should be deleted.
    Line 33, "SO" should read --so--.
    Line 47, "Consequently" should read --Consequently,--.

COLUMN 3

Line 33, "$(t_m$" should read --$(t_{B1}$--.
    Line 34, "$(t_m$" should read --$(t_{B1}$--.

COLUMN 5

Line 15, "is" should read --in---.
    Line 28, "the" should read --The--.

UNITED STATES PATENT AND TRADEMARK OFFICE
CERTIFICATE OF CORRECTION

PATENT NO. : 5,451,798

DATED : September 19, 1995

INVENTOR(S) : HISANORI TSUDA ET AL.  Page 2 of 5

It is certified that error appears in the above-identified patent and that said Letters Patent is hereby corrected as shown below:

COLUMN 10

Line 49, "a" should read --an--.

COLUMN 11

Line 6, "couple" should read --coupled--.
Line 57, "on=state" should read --on-state--.

COLUMN 12

Line 48, "$\phi_s \geq 100$ $_F$." should read --$\phi_s \geq \phi$ $_F$.--.

COLUMN 14

Line 3, "region." should read --regions.--.

COLUMN 16

Line 5, "a" should read --an--.
Line 68, "device)." should read --devices).--.

COLUMN 18

Line 57, "can not" should read --cannot--.

UNITED STATES PATENT AND TRADEMARK OFFICE
CERTIFICATE OF CORRECTION

PATENT NO. : 5,451,798

DATED : September 19, 1995

INVENTOR(S): HISANORI TSUDA ET AL.

It is certified that error appears in the above-identified patent and that said Letters Patent is hereby corrected as shown below:

COLUMN 19

Line 25, "$2 \times 10^{16} cm^{-3}$" should read --$2 \times 10^{15} cm^{-3}$--.

COLUMN 20

Line 35, "can" should read --can be--.
Line 42, "Thirst," should read --First,--.

COLUMN 22

Line 54, "consequently," should read --Consequently,--.
Line 66, "eight" should read --eighth--.
Line 67, "409,m 406" should read --409, 406--.

COLUMN 23

Line 26, "thereafter," should read --Thereafter,--.

COLUMN 24

Line 7, "eight" should read --eighth--.

UNITED STATES PATENT AND TRADEMARK OFFICE
CERTIFICATE OF CORRECTION

PATENT NO. : 5,451,798

DATED : September 19, 1995

INVENTOR(S): HISANORI TSUDA ET AL.

It is certified that error appears in the above-identified patent and that said Letters Patent is hereby corrected as shown below:

COLUMN 25

Line 29, "is" should read --is a-- and "of this example is a" should be deleted.
Line 30, "vertical bipolar transistor" should be deleted.
Line 50, "$Si_3N_4$film" should read --$Si_3N_4$ film--.
Line 61, "$Si_3N_4$film" should read --$Si_3N_4$ film--.

COLUMN 26

Line 5, "$P_+$" should read --$P^+$--.
Line 40, "show8ing" should read --showing--.
Line 42, "example." should read --example,--.

COLUMN 27

Line 1, "e" should read --be--.
Line 21, "N region" should read --$N^-$ region--.

UNITED STATES PATENT AND TRADEMARK OFFICE
CERTIFICATE OF CORRECTION

PATENT NO. : 5,451,798

DATED : September 19, 1995

INVENTOR(S) : HISANORI TSUDA ET AL.

It is certified that error appears in the above-identified patent and that said Letters Patent is hereby corrected as shown below:

<u>COLUMN 28</u>

Line 9, "amount" should read --amounts--.
    Line 51, "in" should be deleted.

Signed and Sealed this

Seventh Day of May, 1996

Attest:

BRUCE LEHMAN

*Attesting Officer*     Commissioner of Patents and Trademarks